(12) United States Patent
Ryu et al.

(10) Patent No.: US 7,842,549 B2
(45) Date of Patent: Nov. 30, 2010

(54) METHODS OF FABRICATING SILICON CARBIDE DEVICES INCORPORATING MULTIPLE FLOATING GUARD RING EDGE TERMINATIONS

(75) Inventors: Sei-Hyung Ryu, Cary, NC (US); Anant K. Agarwal, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 274 days.

(21) Appl. No.: 12/195,700

(22) Filed: Aug. 21, 2008

(65) Prior Publication Data

US 2009/0035926 A1      Feb. 5, 2009

Related U.S. Application Data

(62) Division of application No. 11/268,789, filed on Nov. 8, 2005, now Pat. No. 7,419,877, which is a division of application No. 10/731,860, filed on Dec. 9, 2003, now Pat. No. 7,026,650.

(60) Provisional application No. 60/440,193, filed on Jan. 15, 2003.

(51) Int. Cl.
  *H01L 21/00* (2006.01)
(52) U.S. Cl. ................... 438/108; 438/186; 438/572; 438/E21.158; 257/77
(58) Field of Classification Search ............ 257/52–55, 257/77, 306, 341–347, 484–487, 489; 438/205, 438/167, 196, 268, 519–521, 573–570
See application file for complete search history.

(56) References Cited

U.S. PATENT DOCUMENTS

| | | | |
|---|---|---|---|
| 3,047,439 A | 7/1962 | Van Daal et al. | |
| 3,121,829 A | 2/1964 | Huizing et al. | |
| 3,628,187 A | 12/1971 | DeLoach, Jr. et al. | ....... 331/107 |
| 4,096,622 A | 6/1978 | MacIver | ....... 29/578 |
| 4,329,699 A | 5/1982 | Ishihara et al. | ............ 357/2 |
| 4,484,207 A * | 11/1984 | Nishizawa et al. | ......... 257/192 |
| 4,607,270 A | 8/1986 | Iesaka | .......... 357/15 |

(Continued)

FOREIGN PATENT DOCUMENTS

EP      1076363 A2      2/2001

(Continued)

OTHER PUBLICATIONS

Kinoshita et al. "Guard Ring Assisted RESURF: A New Termination Structure Providing Stable and High Breakdown Voltage for SiC Power Devices," *Tech. Digest of ISPSD '02*, pp. 253-256.

(Continued)

*Primary Examiner*—Dung A. Le
(74) *Attorney, Agent, or Firm*—Myers Bigel Sibley & Sajovec

(57) ABSTRACT

Edge termination for silicon carbide devices has a plurality of concentric floating guard rings in a silicon carbide layer that are adjacent and spaced apart from a silicon carbide-based semiconductor junction. An insulating layer, such as an oxide, is provided on the floating guard rings and a silicon carbide surface charge compensation region is provided between the floating guard rings and is adjacent the insulating layer. Methods of fabricating such edge termination are also provided.

17 Claims, 34 Drawing Sheets

U.S. PATENT DOCUMENTS

| | | | |
|---|---|---|---|
| 4,638,551 A | 1/1987 | Einthoven | 29/571 |
| 4,720,734 A | 1/1988 | Amemiya et al. | 357/15 |
| 4,738,937 A | 4/1988 | Parsons | 437/180 |
| 4,742,377 A | 5/1988 | Einthoven | 357/15 |
| 4,762,806 A | 8/1988 | Suzuki et al. | 437/100 |
| 4,765,845 A | 8/1988 | Takada et al. | 136/258 |
| 4,816,879 A | 3/1989 | Ellwanger | 357/15 |
| 4,866,005 A | 9/1989 | Davis et al. | 437/100 |
| 4,875,083 A | 10/1989 | Palmour | 357/23.6 |
| 4,901,120 A | 2/1990 | Weaver et al. | 357/15 |
| 4,907,040 A | 3/1990 | Kobayashi et al. | 357/4 |
| 4,918,497 A | 4/1990 | Edmond | 357/17 |
| 5,471,072 A | 11/1995 | Papanicolaou | 257/77 |
| 5,565,384 A | 10/1996 | Havemann | |
| 5,712,502 A | 1/1998 | Mitlehner et al. | 257/341 |
| 5,789,311 A | 8/1998 | Ueno et al. | 438/573 |
| 5,801,836 A | 9/1998 | Bakowski et al. | 257/487 |
| 5,907,179 A | 5/1999 | Losehand et al. | 257/475 |
| 5,914,500 A | 6/1999 | Bakowski et al. | 257/77 |
| 5,932,894 A | 8/1999 | Bakowski et al. | 257/76 |
| 5,977,605 A | 11/1999 | Bakowsky et al. | 257/496 |
| 5,994,189 A | 11/1999 | Akiyama | 438/268 |
| 6,002,159 A | 12/1999 | Bakowski et al. | 257/493 |
| 6,005,261 A | 12/1999 | Konstantinov | 257/77 |
| 6,040,237 A | 3/2000 | Bakowski et al. | 438/521 |
| 6,083,814 A | 7/2000 | Nilsson et al. | 438/519 |
| 6,110,813 A | 8/2000 | Ota et al. | 438/597 |
| 6,191,015 B1 | 2/2001 | Losehand et al. | 438/570 |
| 6,313,482 B1 | 11/2001 | Baliga | 257/77 |
| 6,320,205 B1 | 11/2001 | Pfirsch et al. | 257/77 |
| 6,445,054 B1 | 9/2002 | Traijkovic et al. | 257/487 |
| 6,573,128 B1 | 6/2003 | Singh | 438/167 |
| 6,831,345 B2 | 12/2004 | Kinoshita et al. | 257/492 |
| 7,026,650 B2 | 4/2006 | Ryu | 257/77 |
| 7,166,894 B2 | 1/2007 | Templier et al. | |
| 2003/0160274 A1 | 8/2003 | Das et al. | |
| 2004/0238903 A1 | 12/2004 | Zeng et al. | |

FOREIGN PATENT DOCUMENTS

| | | |
|---|---|---|
| EP | 1111688 A1 | 6/2001 |
| JP | 58-148469 | 3/1983 |
| JP | 62-279672 | 6/1988 |
| JP | 63-133569 | 6/1988 |
| JP | 3147331 | 6/1991 |
| JP | 7050420 A | 2/1995 |
| WO | WO 96/03774 | 2/1996 |
| WO | WO97/08754 | 3/1997 |
| WO | WO 01/86727 A2 | 11/2001 |
| WO | WO 03/077321 A2 | 9/2003 |
| WO | WO 2004/066392 A1 | 8/2004 |

OTHER PUBLICATIONS

Katsunori Ueno, Tatsue Urushidani, Kouichi Hahimoto, and Yasukazu Seki. "The Guard -Ring Termination for the High-Voltage SiC Schottky Barrier Diodes." *IEEE Electron Device Letters*. vol. 16. No. 7, Jul. 1995.

Singh, R. and J.W. Palmour. "Planar Terminations in 4H-SiC Schottky Diodes with Low Leakage and High Yields," *IEEE International Symposium on Power Semiconductor Devices and ICs*, 1997.

International Search Report and Written Opinion of the International Searching Authority for corresponding PCT application No. PCT/US2004/001183, mailed Jul. 7, 2004.

Onose et al. *Over 2000 V FLR Termination Technologies for SiC High Voltage Devices*, 12th International Symposium on Power Semiconductor Devices and IC's. Toulousse, France, May 22-25, 2000.

Kosiachenko, L.A. and E.F. Kukhta, V.M. Skiliarchuk, "Light Emission from Metal at Forward Bias of a Shottky Diode," *Zhurnal tekhnicheskoi fiziki* [*Journal of Technical Physics*], vol. 54, No. 6, 1984.

Kyoritsu Shuppan Kabushiki Kaisha, *Crystallography Handbook*.

*The Electrical Engineering Handbook*, Richard C. Dorf, editor, Second Edition, CRC/IEEE Press.

Sze, S.M. *Physics of Semiconductor Devices*, John Wiley & Sons, p. 250-254.

Streetman, B.G. *Solid State Electronic Devices*. Second Edition, Prentice-Hall, 1980, pp. 192-193, 201, 443.

Saidov, M.S., Kh. A. Shamuratov, and A. Umurzakov. "Current-voltage characteristics of silicon carbide heterojunctions." *Soviet Physics of Semiconductors*. vol. 13. No. 9. Sep. 1979. pp. 1054-1056.

Pelletier, J., D. Gervais, and C. Pomot. "Application of Wide Gap Semiconductors to Surface Ionization: Work Functions of AIN and SiC Crystals." *Journal of Applied Physics*. vol. 55, No. 4. Feb. 15, 1984, pp. 994-1002.

Edmond, J.A., J. Ryu, J.T. Glass, and R.F. Davis. "Electrical Contacts to Beta Silicon Carbide Thin Films." *Journal of the Electromechanical Society*. vol. 135. No. 2. Feb. 1988. pp. 359-362.

Waldrop, J.R. and R.W. Grant. "Formation and Schottky barrier height of metal contacts to $\beta$-SiC." *Applied Physics Letters*. vol. 56, No. 6, Feb. 5, 1990, pp. 557-559.

Ioannou, D.E. and N.A. Papanicolaou. "Deep Level Transient Spectroscopy of $\beta$-SiC Layers." *Abstracts*. Fourth. National Review Meeting on Growth and Characterization of SiC and Its Employment in Semiconductor Applications.

Anikin, M.M. et al. "Electrostatic properties of SiC-6H structures with an abrupt pin junction," *Soviet Physics Semiconductors*, Jan. 1988, vol. 22(1): pp. 80-83.

Glover, G.H. "Charge Multiplication in Au—SiC (6H) Schottky Junctions." *Journal of Applied Physics*. Nov. 1975. vol. 46. No. 11: pp. 4842-4844.

Ioannou et al. "The Effect of Heat Treatment on Au Schottky Contacts on $\beta$-SiC." *IEEE Transactions on Electron Devices*. Aug. 1979, vol. Ed-34. No. 8: pp. 1694-1699.

Violin, E.E., et al. "Light Emitting Devices Based on Silicon Carbide." *Silicon Carbide*, 1973, p. 565. (edited by Marshall, Faust, Ryan).

Powell, J.A. "Silicon Carbide: Progress in Crystal Growth." *Material Research Society Symposium Proceedings*. 1987. vol. 97: pp. 159-168.

Konstantinov, A.O. "Ionization Rates and Critical Fields in 4H Silicon Carbide," *Appl. Phys. Lett*. vol. 71, No. 1, Jul. 1997, pp. 90-92.

Appels et al. "High-voltage thin layer devices (RESURF devices)," *IEDM Tech. Dig*., 1979, pp. 238-241.

Li et al. "Theoretical and Experimental Study of 4H-SiC Junction Edge Termination," *Materials Science Forum*, vols. 338-342 (2000), pp. 1375-1378.

Merchant et al. "Realization of High Breakdown Voltage (>700V) in Thin SOI Devices," *Tech. Digest of ISPSD '91*, pp. 31-34.

Yilmaz, Hamza, "Optimization and Surface Charge Sensitivity of High Voltage Blocking Structures with Shallow Junctions," *IEEE Transactions on Electron Devices*, vol. 38, No. 3, Jul. 1991, pp. 1666-1675.

Notification of International Search Report and Written Opinion for PCT/US2007/000471; date of mailing May 31, 2007.

\* cited by examiner

X-field

Y-field

Y-field

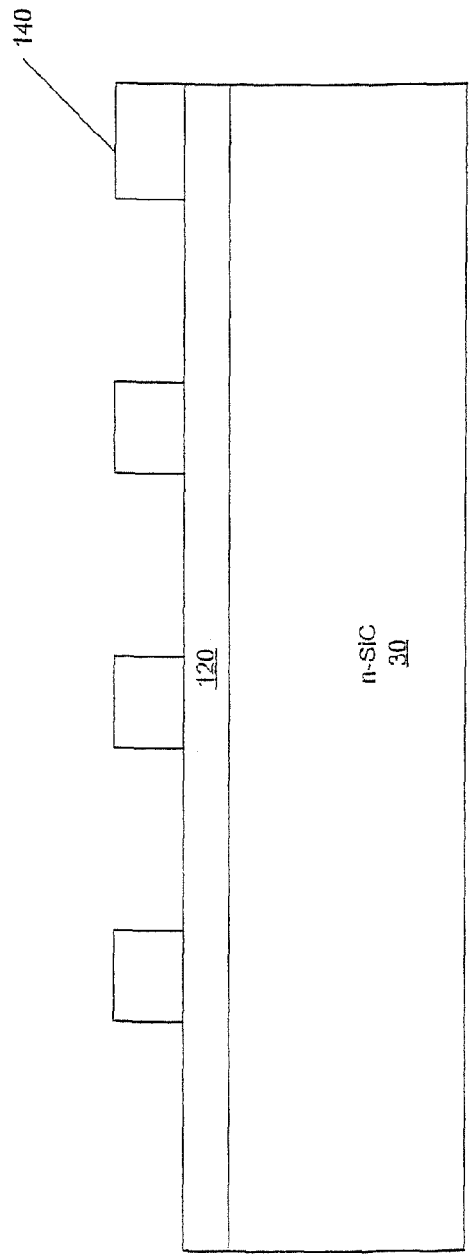
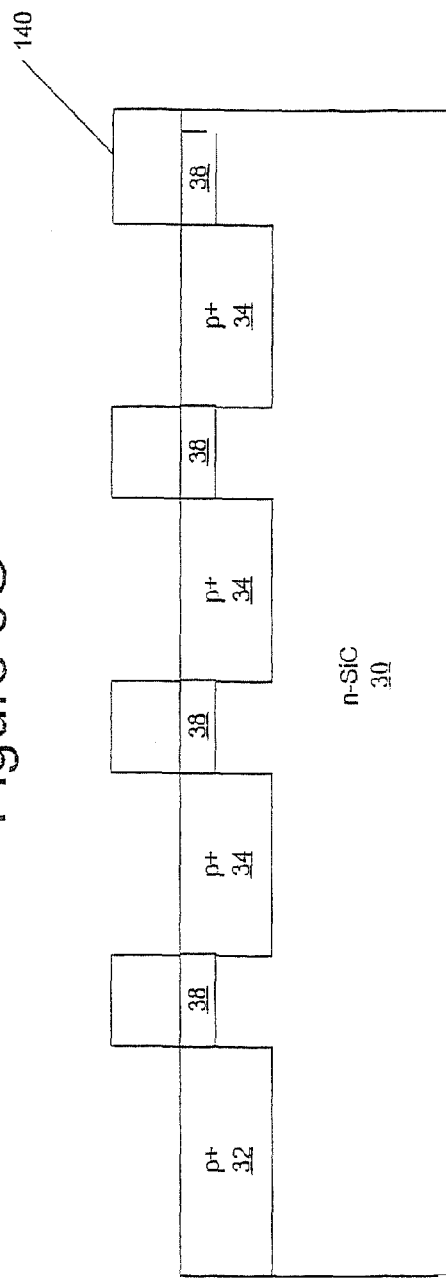

METHODS OF FABRICATING SILICON CARBIDE DEVICES INCORPORATING MULTIPLE FLOATING GUARD RING EDGE TERMINATIONS

RELATED APPLICATIONS

The present application claims priority to and is a divisional of U.S. application Ser. No. 11/268,789, entitled "MULTIPLE FLOATING GUARD RING EDGE TERMINATION FOR SILICON CARBIDE DEVICES AND METHODS OF FABRICATING SILICON CARBIDE DEVICES INCORPORATING SAME" and filed Nov. 8, 2005, now U.S. Pat. No. 7,419,877 which is a divisional of U.S. application Ser. No. 10/731,860 U.S. Pat. No. 7,026,650, entitled "MULTIPLE FLOATING GUARD RING EDGE TERMINATION FOR SILICON CARBIDE DEVICES" and filed Dec. 9, 2003, which claims the benefit of U.S. Provisional Patent Application Ser. No. 60/440,193, entitled "MULTIPLE FLOATING GUARD RING EDGE TERMINATION FOR SILICON CARBIDE DEVICES AND METHODS OF FABRICATING SILICON CARBIDE DEVICES INCORPORATING SAME," and filed Jan. 15, 2003, the disclosures of which are incorporated herein by reference as if set forth fully.

FIELD OF THE INVENTION

The present invention relates microelectronic devices and more particularly to edge termination for silicon carbide devices.

BACKGROUND OF THE INVENTION

High voltage silicon carbide (SiC) Schottky diodes, which can handle voltages between, for example, about 600V and about 2.5 kV, are expected to compete with silicon PIN diodes fabricated with similar voltage ratings. Such diodes may handle as much as about 100 amps or more of current, depending on their active area. High voltage Schottky diodes have a number of important applications, particularly in the field of power conditioning, distribution and control.

An important characteristic of a SiC Schottky diode in such applications is its switching speed. Silicon-based PIN devices typically exhibit relatively poor switching speeds. A silicon PIN diode may have a maximum switching speed of approximately 20 kHz, depending on its voltage rating. In contrast, silicon carbide-based devices are theoretically capable of much higher switching speeds, for example, in excess of about 100 times better than silicon. In addition, silicon carbide devices may be capable of handling a higher current density than silicon devices.

A conventional SiC Schottky diode structure has an n-type SiC substrate on which an n⁻ epitaxial layer, which functions as a drift region, is formed. The device typically includes a Schottky contact formed directly on the n⁻ layer. Surrounding the Schottky contact is a p-type JTE (junction termination extension) region that is typically formed by ion implantation. The implants may be aluminum, boron, or any other suitable p-type dopant. The purpose of the JTE region is to reduce or prevent the electric field crowding at the edges, and to reduce or prevent the depletion region from interacting with the surface of the device. Surface effects may cause the depletion region to spread unevenly, which may adversely affect the breakdown voltage of the device. Other termination techniques include guard rings and floating field rings that may be more strongly influenced by surface effects. A channel stop region may also be formed by implantation of n-type dopants such as Nitrogen or Phosphorus in order to prevent the depletion region from extending to the edge of the device.

Additional conventional terminations of SiC Schottky diodes are described in "Planar Terminations in 4H—SiC Schottky Diodes With Low Leakage And High Yields" by Singh et al., ISPSD '97, pp. 157-160. A p-type epitaxy guard ring termination for a SiC Schottky Barrier Diode is described in "The Guard-Ring Termination for High-Voltage SiC Schottky Barrier Diodes" by Ueno et al., IEEE Electron Device Letters, Vol. 16, No. 7, July, 1995, pp. 331-332. Additionally, other termination techniques are described in published PCT Application No. WO 97/08754 entitled "SiC Semiconductor Device Comprising A PN Junction With A Voltage Absorbing Edge."

As briefly discussed above, Junction termination extension (JTE), multiple floating guard rings (MFGR) and field plates (FP) are commonly used termination schemes in high voltage silicon carbide devices. JTE may be very effective edge termination, however JTE may also require tight control of the product of the active doping concentration and junction depth. Furthermore, additional fabrication costs may be incurred as a result of added photolithography and implantation steps.

FP is also a conventional technique for edge termination of a device and may be cost-effective. In conventional FP devices, high fields are supported by the oxide layer under the metal field plate. This technique performs well for silicon devices where the highest field in the semiconductor is relatively low. However, in SiC devices the electric fields in the blocking state may be very high (~2 MV/cm) which multiplies by a factor of 2.5 at the oxide-semiconductor interface. This leads to very high oxide fields and may result in long-term reliability problems. Thus, FP may be unsuitable for use in SiC devices.

Multiple floating guard rings in addition to JTE has been proposed as a technique for reducing the sensitivity of the JTE to implant dose variation. See Kinoshita et al., "Guard Ring Assisted RESURF: A New Termination Structure Providing Stable and High Breakdown Voltage for SiC Power Devices," Tech. Digest of ISPSD '02, pp. 253-256. Kinoshita et al. reported that such techniques reduced the sensitivity to implant dose variation. However, the area utilized for termination was increased to almost three times the area of JTE alone as the guard rings are added to both the inner edge of the JTE and the outside of the JTE.

MFGR may also be a cost-effective method of edge termination because it may use fewer fabrication steps than JTE. However, MFGR may be very sensitive to surface charges in the oxide-semiconductor interface. The ideal electric field profile of an ideal Multiple Floating Guard Rings (MFGR) termination is shown in FIGS. 1A through 1D. FIG. 1A illustrates a conventional MFGR device where the spacing between the p-type SiC guard rings is illustrated as constant for simplicity. At the blocking state, the depletion region starts at the main junction and expands both laterally and vertically. Once the depletion region punches through to the first guard ring, the potential of the first guard ring gets pinned to that of the main junction. At this point, the punch-through side of the guard ring injects a small amount of holes into the n-region. This lost charge is replaced by the depletion of the n charge from the outer edge of the guard ring. This punch-through and charge injection continues on until the depletion region reaches the final guard ring. Since the amounts of n-charge depleted between the guard rings are the same (constant spacing MFGR's), the peak x-field each guard ring sees is the same for all guard rings, as shown in FIG. 1B. However, as seen in FIG. 1C, the peak y-field is different for all guard rings because the amount of n-charge depletion is different for all guard rings. The highest y-field value is present at the main junction and successive guard rings have reduced levels of y-field. The vector sum of the x and the y fields is illustrated in FIG. 1D, and shows the highest electric field at the bottom corner of the main junction (circled in FIG. 1A). Therefore, breakdown is expected to happen at the circled bottom edge of the main junction if equally spaced MFGR termination is used. If it is desired that each floating guard ring supports the same electric fields, the spacing between the guard rings may vary. The spacing between the main junction and the innermost guard ring may be the smallest, and the spacing at the outer-most guarding may be the largest.

One potentially critical issue with the MFGR termination scheme is that it is very sensitive to the charge at the oxide-semiconductor interface. The net charge at metal-oxide-semiconductor (MOS) gate regions of MOS transistors can be very low. However, field oxides often typically have lower quality when compared to thermally grown gate oxides and plasma processing steps may result in higher oxide charges. When a large amount of positive charge is present at the oxide-semiconductor interface, the surface of the lightly doped n-layer turns into n+ regions, which compresses the equi-potential lines. This results in very high field at the oxide-semiconductor interface and, therefore, reduces the effectiveness of the floating guard rings that may result in a reduction of blocking voltage for the devices. In addition, this charge, mostly positive, can move towards or away from the oxide-semiconductor interface, causing time dependent breakdown voltage, or breakdown walk-out. Breakdown walk-out refers to a phenomenon where the breakdown voltage starts at a first value and increases with time and bias. This problem may be even greater in silicon carbide devices because the field oxides are generally deposited. Deposited oxides, typically, have inferior characteristics to those of thermally grown layers, and the oxide-semiconductor interface in a silicon carbide device has much greater charge density compared to that of a silicon device.

Putting Offset Field Plates on each guard ring was suggested in Yilmaz, "Optimization and Surface Charge Sensitivity of High Voltage Blocking Structures with Shallow Junctions," *IEEE Transactions on Electron Devices*, Vol. 38, No. 3, July 1991, pp. 1666-1675. Such a structure is illustrated in FIG. 2. As seen in FIG. 2, an n-type semiconductor layer 10 has a main junction 12 and a series of floating guard rings 14 formed therein. An oxide layer 16 is provided on the semiconductor layer 10 and openings are provided in the oxide layer 16. The offset field plates 18 are provided in the openings to contact the floating guard rings 14 and to extend onto the oxide layer 16.

Yilmaz demonstrated that the voltage that each guard ring supports can be distributed evenly and the sensitivity to parasitic charges can be reduced by spreading the equipotential lines near the interface. This technique can be implemented in silicon devices relatively easily because the doping densities of the drift layer in silicon devices are generally low, and guard rings can have reasonably large spacing between them. However, in silicon carbide devices, the doping densities in the drift layer can be up to 100 times or more than that of a silicon device with the same blocking capability and the electric field each guard ring supports may be up to 10 times or more greater than that of a silicon device. Therefore, the guard rings may need to be placed much closer to each other compared to a silicon device, and the field oxide thickness that may be needed may be much thicker than that used in silicon devices. Such requirements may be difficult to achieve with conventional fabrication techniques, such as photolithography, for silicon carbide devices because the Offset Field Plate-Floating Guard Ring structure has each field plate contacting each guard ring separately and the edge of the guard ring should not overlap with the edge of the next guard ring. To meet these requirements, each guard ring may need to be enlarged, and the alignment tolerance of the guard rings should be less than 0.25 μm. Such alignment requirements may be difficult, if not impossible, to achieve with conventional contact aligners for SiC. Step coverage may also be another issue with the Offset Field Plate-Floating Guard Ring structure because the thickness of the oxide that may be needed. Additionally, in field plate designs the quality of the oxide may be important in achieving acceptable results as it is the oxide that supports the field or voltages. Oxides in silicon carbide devices, generally have lower quality than that available in silicon devices. Accordingly, the Offset Field Plate-Floating Guard Ring structure may not be practical for silicon carbide devices.

SUMMARY OF THE INVENTION

Embodiments of the present invention may provide an edge termination for silicon carbide devices having a plurality of concentric floating guard rings in a silicon carbide layer that are adjacent and spaced apart from a silicon carbide-based semiconductor junction. An insulating layer, such as an oxide, is provided on the floating guard rings and a silicon carbide surface charge compensation region is provided between the floating guard rings and is adjacent the insulating layer.

In particular embodiments of the present invention, the floating guard rings extend a first distance into the silicon carbide layer and the surface charge compensation region extends a second distance into the silicon carbide layer. The second distance may be less than the first distance, in some embodiments. In further embodiments, the surface charge compensation region is lighter doped than the guard rings. The surface charge compensation region may extend between adjacent ones of the floating guard rings so as to contact adjacent ones of the floating guard rings. Alternatively, the surface charge compensation region may extend between adjacent ones of the floating guard rings but only contact one of the adjacent floating guard rings.

The surface charge compensation region may be provided in certain embodiments by implanting a dopant in the silicon carbide layer, either before or after formation of the floating guard rings, so as to provide the surface charge compensation layer. The surface charge compensation region may, thus, be provided as several surface charge compensation regions, may be provided as a single region that overlaps the floating guard rings and/or may be provided as combinations thereof. The surface charge compensation region may also be provided as a second silicon carbide layer on the silicon carbide layer. Such a second layer may, for example, be provided by epitaxial growth of a silicon carbide layer.

The surface charge compensation region may, in some embodiments of the present invention, have a dopant concentration such that the surface of the surface charge compensation region adjacent the oxide layer is partially depleted by surface charges of the oxide layer and fully depleted when a reverse bias is applied to the device. Thus, in certain embodiments, despite the presence of a surface charge compensating region between the guard rings, when a maximum blocking voltage is applied to the device, the guard rings may be isolated from one another. In some embodiments of the present invention, the surface charge compensation region has a dose charge of from about $1\times10^{12}$ to about $7\times10^{12}$ cm$^{-2}$, where the dose charge is the dopant concentration multiplied by the depth of the surface charge compensation layer. The surface charge compensation region may, in some embodiments, extend a distance of from about 0.1 µm to about 2.0 µm into the silicon carbide layer. Furthermore, in embodiments of the present invention where the surface charge compensation region does not connect adjacent floating guard rings, a gap of from about 0.1 µm to about 2.0 µm may be provided.

In particular embodiments of the present invention, the floating guard rings may be uniformly spaced, non-uniformly spaced or combinations of uniformly and non-uniformly spaced. Furthermore, the guard rings may extend from about 0.1 µm to about 2.0 µm into the silicon carbide layer. The guard rings may have a spacing of from about 0.1 µm to about 10 µm. Additionally, in certain embodiments of the present invention, from about 1 to about 100 guard rings may be provided. The guard rings may extend a distance of from about 2 µm to about 1 mm from the main junction of the device. The floating guard rings may have a dopant concentration of from about $1\times10^{18}$ cm$^{-3}$ to about $1\times10^{20}$ cm$^{-3}$.

In further embodiments of the present invention, the silicon carbide layer is an n-type silicon carbide layer and the guard rings and surface charge compensation layer are p-type silicon carbide. Complementary structures are also provided.

Methods of fabricating edge termination structures are recited herein are also provided.

The advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DESCRIPTION OF THE DRAWINGS

FIGS. 6A through 6J are cross sections illustrating methods of fabricating edge termination structures according to embodiments of the present invention;

DETAILED DESCRIPTION

The present invention will now be described with reference to the figures which illustrate various embodiments of the present invention. As illustrated in the Figures, the sizes of layers or regions are exaggerated for illustrative purposes and, thus, are provided to illustrate the general structures or the present invention. Furthermore, various aspects of the present invention are described with reference to a layer being formed on a substrate or other layer. As will be appreciated by those of skill in the art, references to a layer being formed on another layer or substrate contemplates that additional layers may intervene. References to a layer being formed on another layer or substrate without an intervening layer are described herein as being formed "directly" on the layer or substrate. Like numbers refer to like elements throughout.

As is described in more detail below, embodiments of the present invention may provide improved edge termination of semiconductor devices, such as P-N, Schottky, PiN or other such semiconductor devices. Particular embodiments of the present invention provide edge termination for silicon carbide (SiC) devices. For example, embodiments of the present invention may be utilized as edge termination for SiC Schottky diodes, junction barrier Schottky (JBS) diodes PiN diodes, thyristors, transistors, or other such SiC devices. Embodiments of the present invention may reduce the sensitivity of a multiple floating guard ring termination to oxide-semiconductor surface charges. In particular embodiments, a surface charge compensation layer, such as a thin p-type layer, is provided in addition to the multiple floating guard rings. The surface charge compensation layer is used to at least partially neutralize the effects of charges at oxide-semiconductor interfaces in the silicon carbide devices.

Figure 1A:
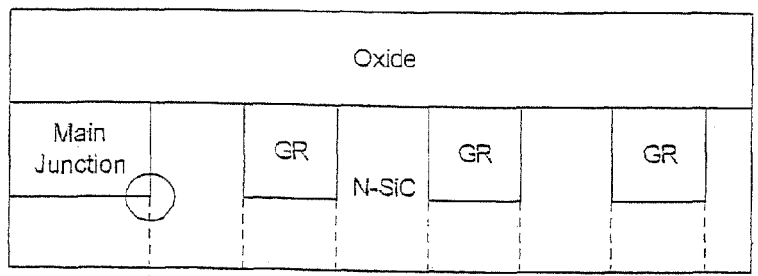
FIG. 1 is a diagram of a conventional MFGR structure and the ideal field profile of that structure.
Figure 1B:
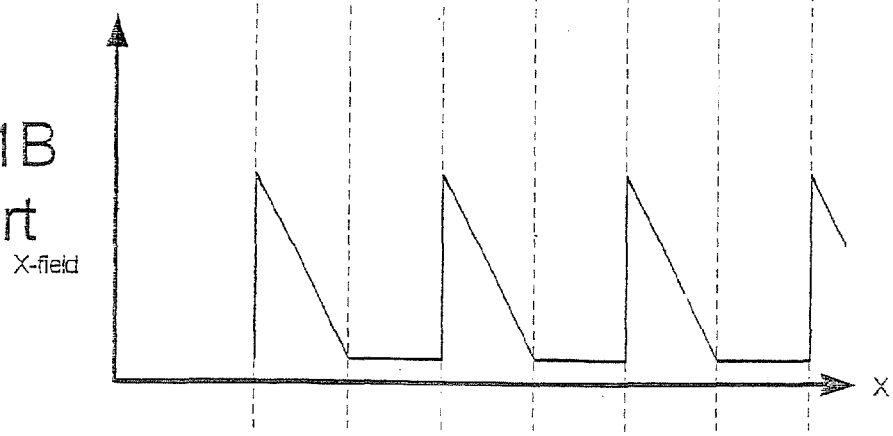
Figure 1C:
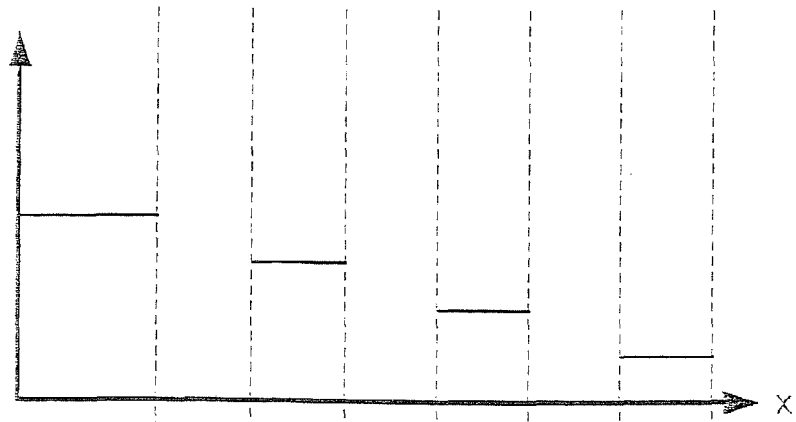
Figure 1D:
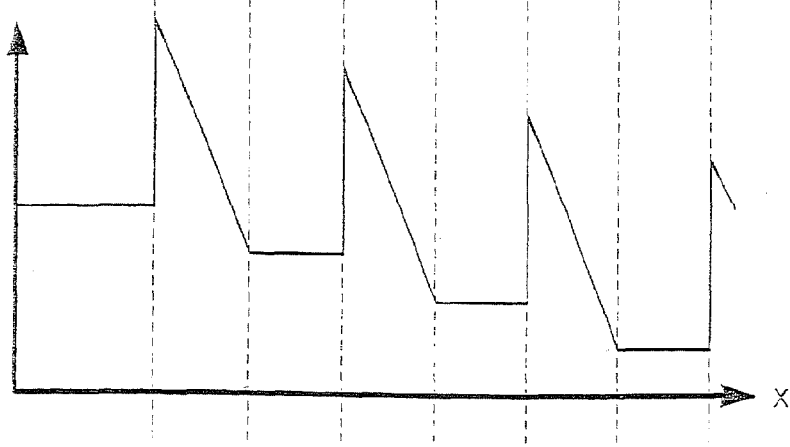
Figure 2:
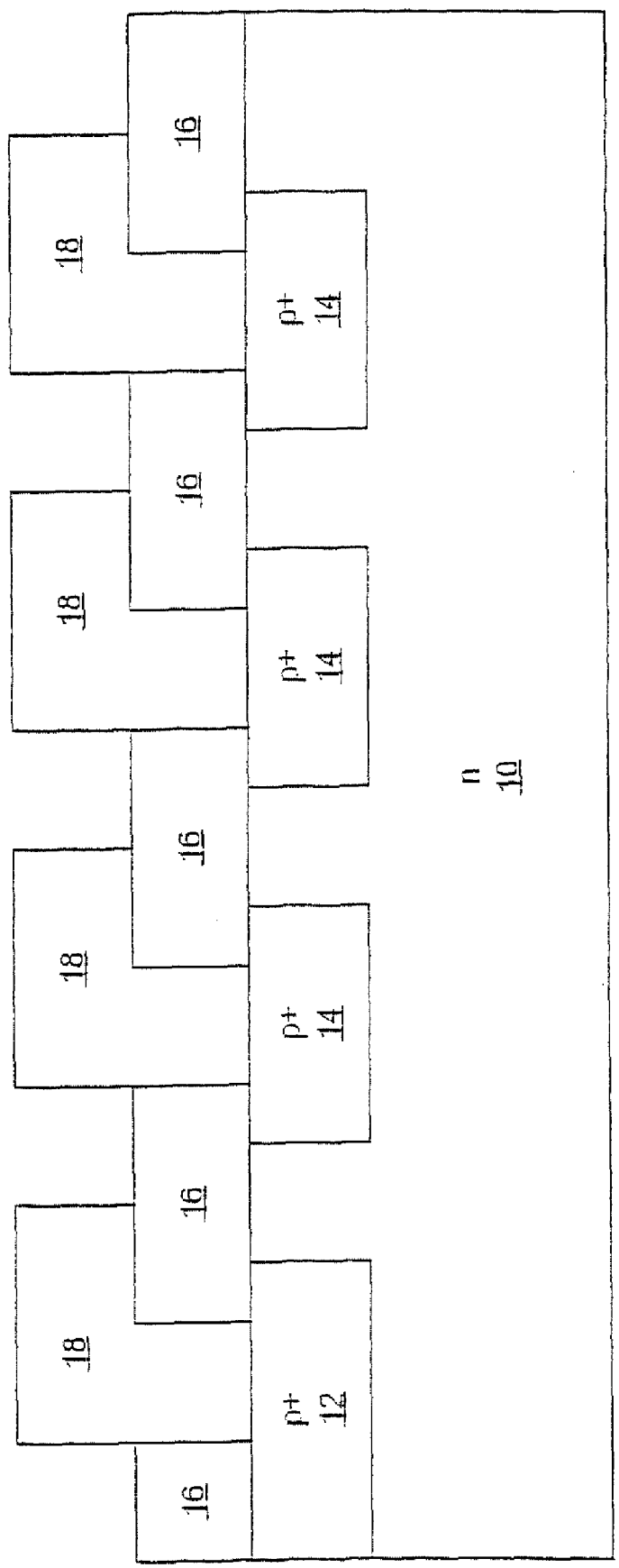
FIG. 2 is a diagram of an MFGR structure with offset field plates.
Figure 3:
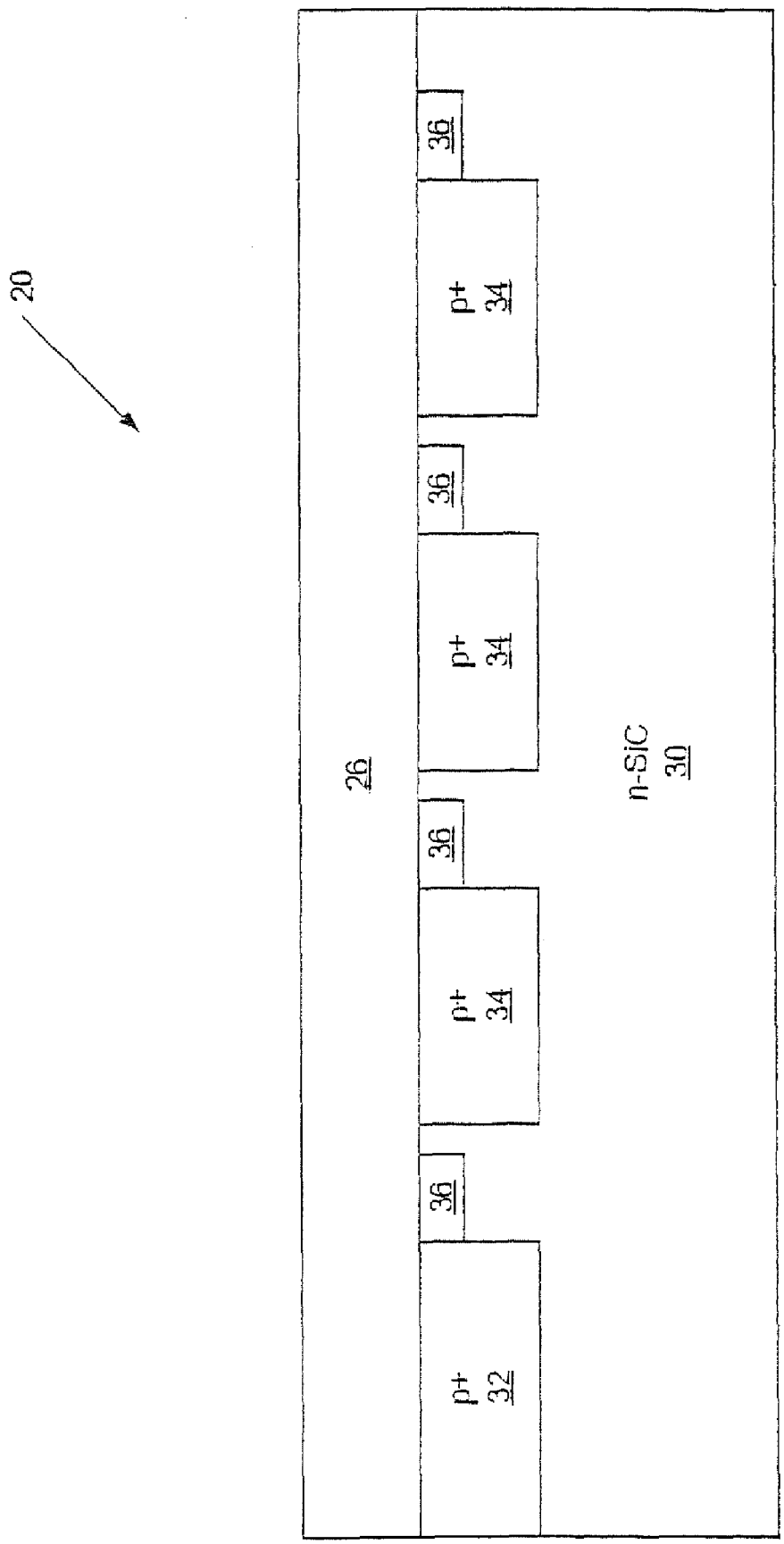
FIG. 3 is a cross section of an edge termination structure according to embodiments of the present invention.

FIG. 3 is a cross section of a silicon carbide semiconductor device 20 illustrating particular embodiments of the present invention. As illustrated in FIG. 3, a silicon carbide layer 30, such as a lightly doped n-type silicon carbide layer, has formed therein a main junction 32, for example, of p-type silicon carbide, and a plurality of floating guard rings 34, such as p-type silicon carbide floating guard rings. An insulating layer 26, such as an oxide layer, is provided on the silicon carbide layer 30. The insulating layer 26 may be a deposited or grown oxide and may be fabricated utilizing techniques known to those of skill in the art. In particular embodiments of the present invention, the insulating layer 26 may be an oxide, such as SiO$_2$, a nitride, such as Si$_3$N$_4$, an oxide-nitride-oxide structure and/or an oxynitride or organic films such as a polyimide layer.

As is further illustrated in FIG. 3, thin regions of silicon carbide, such as p-type silicon carbide, are provided between the spaced apart floating guard rings 34 to spread the equipotential lines to reduce the surface field and thus provide surface charge compensation regions or layers 36. As seen in FIG. 3, respective ones of the surface charge compensation regions 36 may be adjacent and contacting a first of two adjacent guard rings 34 and extend from the first guard ring towards the second of the two adjacent guard rings 34. Alternatively, two or more thin regions of silicon carbide could be provided between adjacent ones of the floating guard rings 34 and the two or more thin regions could extend from respective ones of the floating guard rings toward each other. In other embodiments of the present invention, the surface charge compensation regions 36 need not be identical in size, doping, shape or location relative to the adjacent guard rings 34. The surface charge compensation regions 36 may be provided, for example, as a layer of p-type silicon carbide.

For the structure illustrated in FIG. 3 where p-type silicon carbide surface charge compensation regions are provided in an n-type silicon carbide layer, the dose charge (concentration×depth=dose) of the surface charge compensation regions or layers 36 should be from about $1 \times 10^{12}$ to about $5 \times 10^{12}$ cm$^{-2}$. The oxide-semiconductor interface is expected to have from about $1 \times 10^{12}$ to about $2 \times 10^{12}$ cm$^{-2}$ of positive charge. The surface of the surface charge compensation regions 36 will, typically, be depleted by the positive surface charges, and the negative charges in the depletion region in the surface charge compensation regions 36 will terminate the E-field lines originating from the oxide interface charges, and neutralize the negative effects of the positive interface charges. Furthermore, the amount of charge in the surface charge compensation regions 36 is small enough so that these regions can be completely depleted at a lower voltage (lower than the blocking voltage of the device), which may be required for guard rings to function properly. Therefore, surface charge compensation regions 36 may make the multiple floating guard ring termination less sensitive or insensitive to the changes in the oxide charge. Thus, operation of the surface charge compensation regions 36 according to embodiments of the present invention may function very differently from the JTE termination that utilizes the RESURF principle Appels et al., "*High-voltage thin layer devices (RESURF devices)*," IEDM Tech. Dig., 1979, pp. 238-241, because the function the surface charge compensation regions 36 described herein is to compensate for the oxide charges, whereas the p-layer in a conventional JTE is used to terminate the charge in the depletion region of the drift layer vertically, so that the lateral field is minimized.

Figure 4:
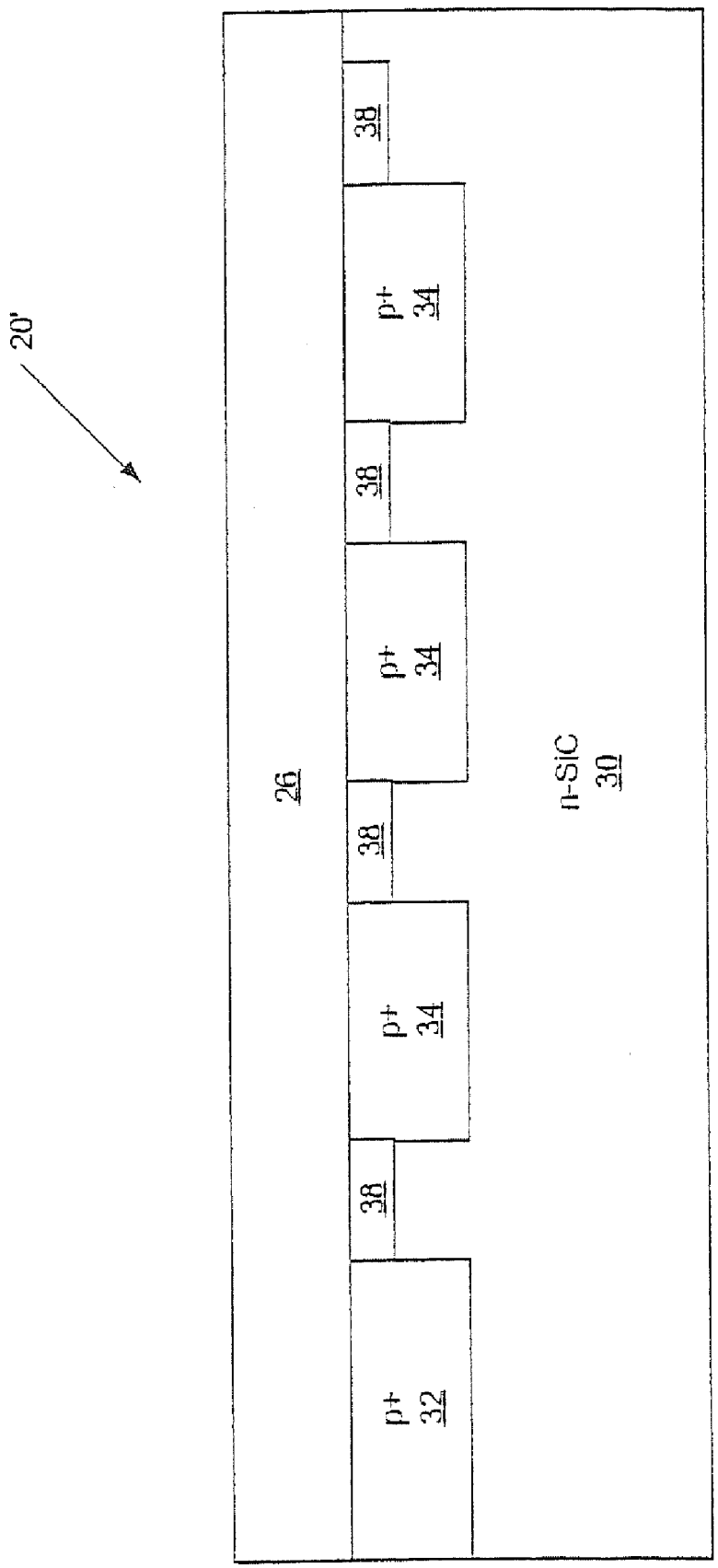
FIG. 4 is a cross section of an edge termination structure according to further embodiments of the present invention.

While the structure illustrated in FIG. 3 may be effective at compensating for oxide charges, the small spacing between the floating guard rings that are provided in silicon carbide devices may make fabrication of such devices difficult because of the tight alignment tolerances that may be needed for photolithography. Therefore, in silicon carbide devices, it may be more practical to merge all surface-charge compensating p-layers into one pattern, connecting all guard rings as shown in FIG. 4. Thus, as illustrated in FIG. 4, a silicon carbide device 20' is provided having a surface charge compensation layer 38 that is provided between adjacent ones of the floating guard rings 34. In the device 20' the charge compensating layer 38 is illustrated as a p-type silicon carbide layer. This p-layer 38 may have the same total charge of from about $1 \times 10^{12}$ to about $7 \times 10^{12}$ cm$^{-2}$, which is the same as that illustrated in FIG. 3. The charge in the p-layer 38 will neutralize the positive oxide charge, and therefore making the device less sensitive to the oxide-semiconductor interface charges.

The surface charge compensation regions/layer 36, 38 may, in some embodiments, have a thickness of from about 0.1 μm to about 2 μm. Furthermore, in embodiments of the present invention where the surface charge compensation regions 36 do not connect adjacent floating guard rings, a gap of from about 0.1 μm to about 2 μm may be provided.

In particular embodiments of the present invention, the floating guard rings 34 may be uniformly spaced, non-uniformly spaced or combinations of uniformly and non-uniformly spaced. Furthermore, the guard rings 34 may extend from about 0.1 μm to about 2 μm into the silicon carbide layer. The guard rings 34 may have a spacing of from about 0.1 μm to about 10 μm. Additionally, in certain embodiments of the present invention, from about 1 to about 100 guard rings 34 may be provided. The guard rings may 34 extend a distance of from about 2 μm to about 1 mm from the main junction of the device. The floating guard rings 34 may have a dopant concentration of from about $1 \times 10^{18}$ cm$^{-3}$ to about $1 \times 10^{20}$ cm$^{-3}$.

In fabricating devices according to certain embodiments of the present invention, the p-layer 38 or p-type regions 36 may be formed before or after formation of the guard rings 34. Such regions 36 or layer 38 may be provided by, for example, ion implantation, or other techniques known to those of skill in the art. Alternatively, the p-layer and/or p-regions may be an epitaxially grown layer of SiC or deposited layer of SiC that is formed on the layer 30 and, in the case of the regions, patterned to provide the desired surface charge compensation regions and/or layers. In such case, the guard rings may be formed prior to formation of the SiC layer or after formation of the SiC layer.

Figure 5A:
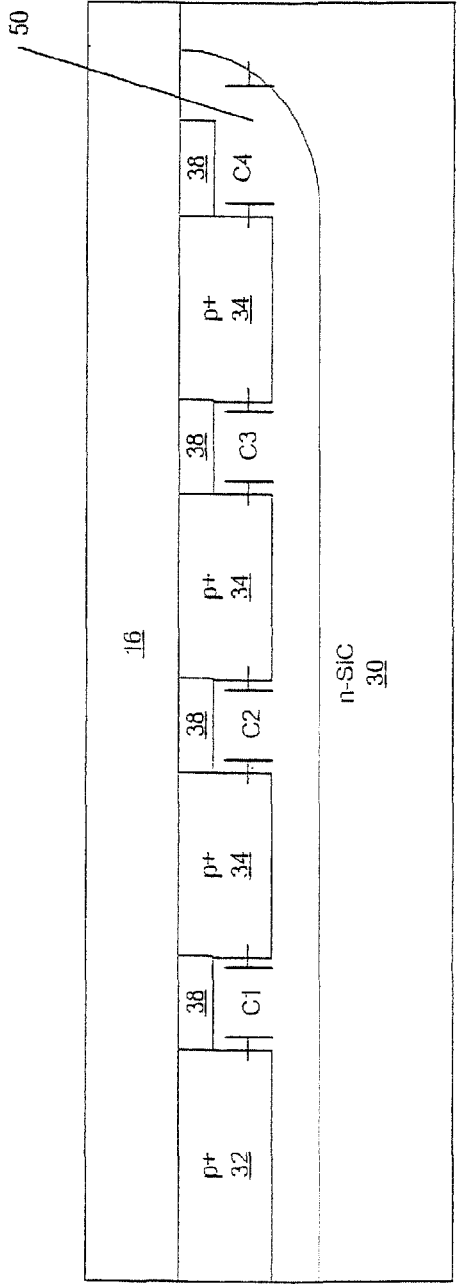
FIGS. 5A and 5B are cross sections illustrating possible operation of an edge termination structure according to embodiments of the present invention.
Figure 5B:
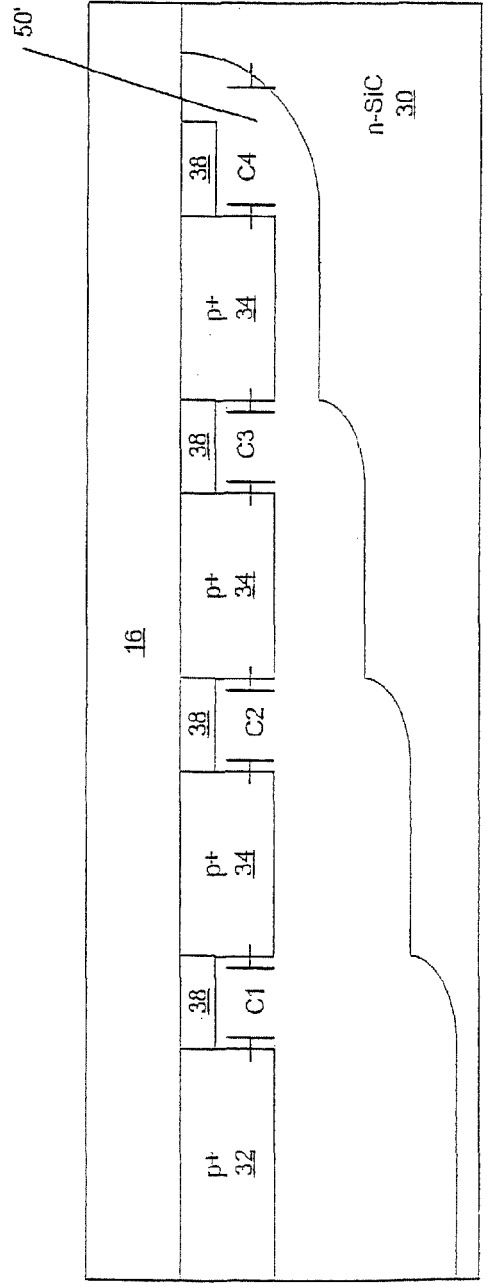

The operation of the termination according to certain embodiments of the present invention is illustrated in FIGS. 5A and 5B. When a small reverse bias is applied, the neutral part of the surface charge compensation layer (SCCL) 38 (i.e., the portion of the layer 38 that has not been depleted by the oxide charge) starts being depleted and provides the depletion region 50 as illustrated in FIG. 5A. Because the SCCL 38 is not totally depleted, all guard rings are electrically connected at this point, and the portion of the SCCL 38 that extends out of the outer-most guard ring prevents premature breakdown by spreading the depletion region, as shown in FIG. 5A. With application of a higher reverse bias, the SCCL 38 becomes fully depleted, and the guard rings become electrically isolated. However, the guard rings are still coupled to each other by the capacitances (see C1, C2, C3 and C4 illustrated in FIG. 5A). The voltage applied to the device is divided according to the capacitances between the guard rings.

For example, if in FIG. 5A, V1 is the voltage between the main junction 32 and the first guard ring 34, V2 is the voltage between the first guard ring 34 and the second guard ring 34, V3 is the voltage between the second guard ring and the third guard ring and V4 is the voltage between the third guard ring and the n-layer 30, then V1=((1/C1)/(1/C1+1/C2+1/C3+1/C4))*Total Voltage, where the Total Voltage is V1+V2+V3+V4. The potential of each guard ring is determined by this capacitance ratios and applied reverse bias voltage, which then determines the width of the depletion under each guard ring in the vertical direction. The potential of each guard ring increases as it gets closer to the main junction. As a result, the smoothly spread-out depletion region 50' shown in FIG. 5B can be achieved.

While embodiments of the present invention have been illustrated with reference to a P-N main junction, as will be appreciated by those of skill in the art in light of the present disclosure, edge termination techniques according to embodiments of the present invention may be utilized with other devices and/or junction types, such as Schottky junctions.

Figure 6A:
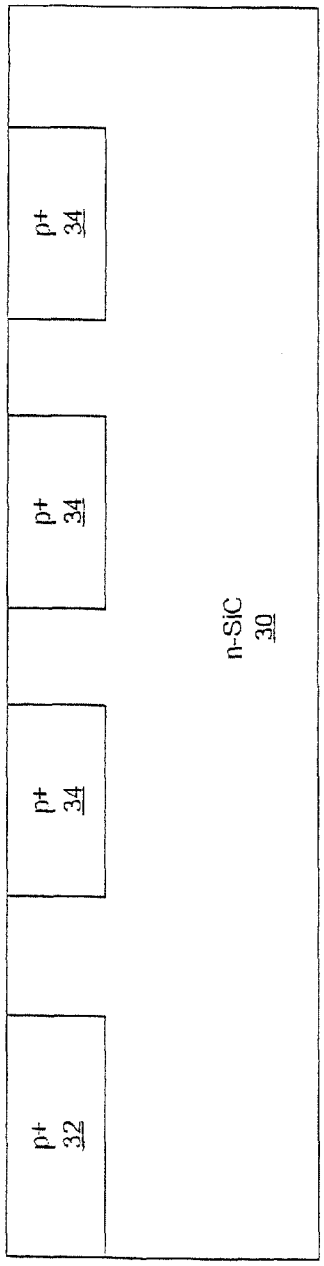

Methods of fabricating junction edge termination structures according to embodiments of the present invention will now be described with reference to FIGS. 6A through 6J. As seen in FIG. 6A, a silicon carbide layer 30 has formed in it a junction 32 and spaced apart concentric floating guard rings 34. Such regions may be formed, for example, ion implantation into a silicon carbide substrate and/or epitaxial layer.

Figure 6B:
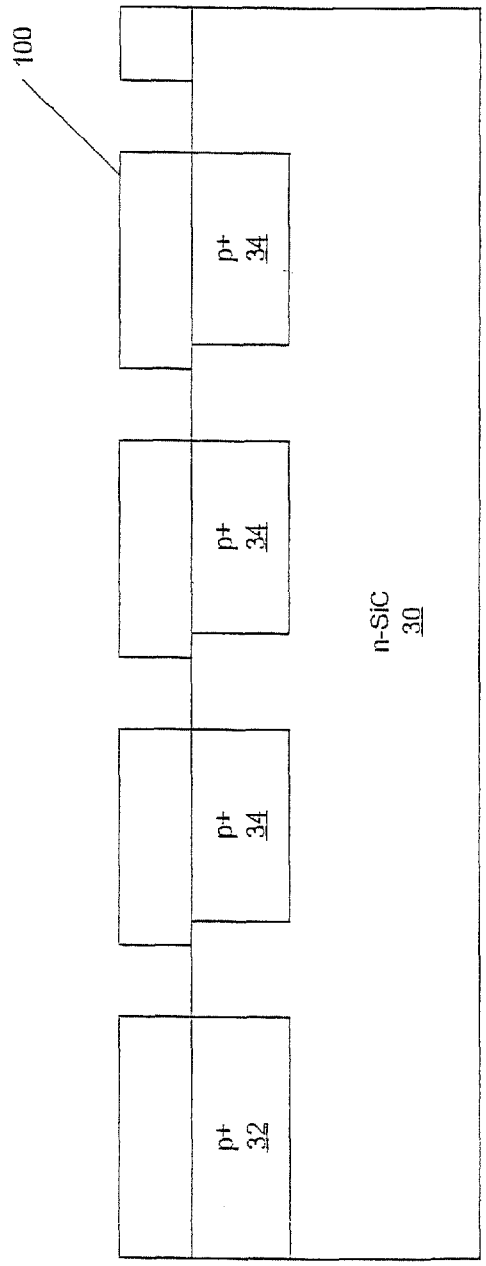

As is seen in FIG. 6B, a mask layer 100 may be formed and patterned on the silicon carbide layer and may correspond to the junction 32 and guard ring 34 regions. The mask layer 100 may be made of conventional mask materials and may, for example, be patterned using conventional photolithography or other such techniques known to those of skill in the art. The mask layer 100 opens windows adjacent the junction 32 and the guard rings 34. The windows may extend partly or completely between adjacent guard rings 34 and/or a guard ring 34 and the junction 32.

Figure 6C:
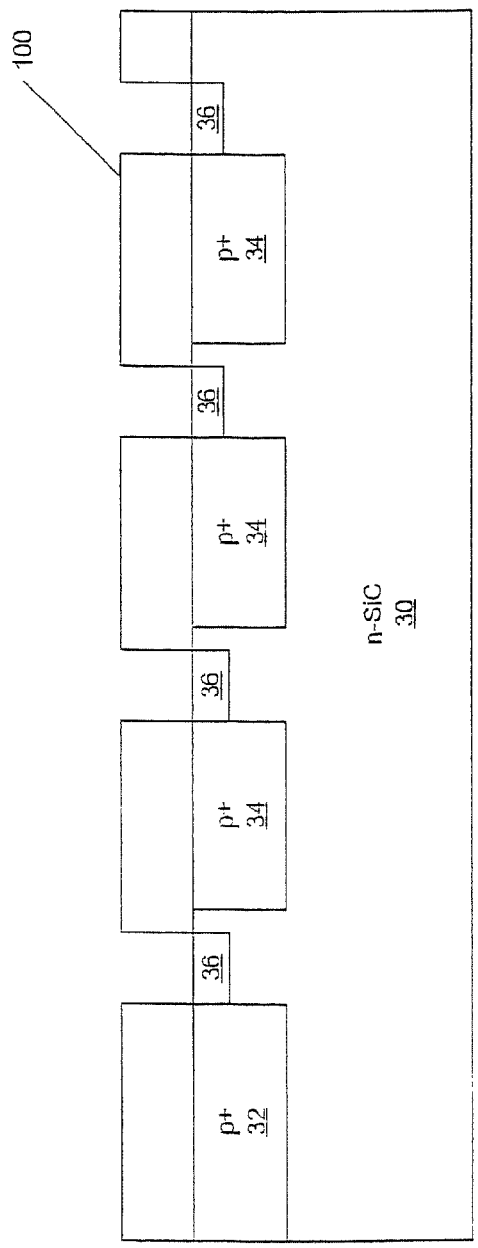
Figure 6D:
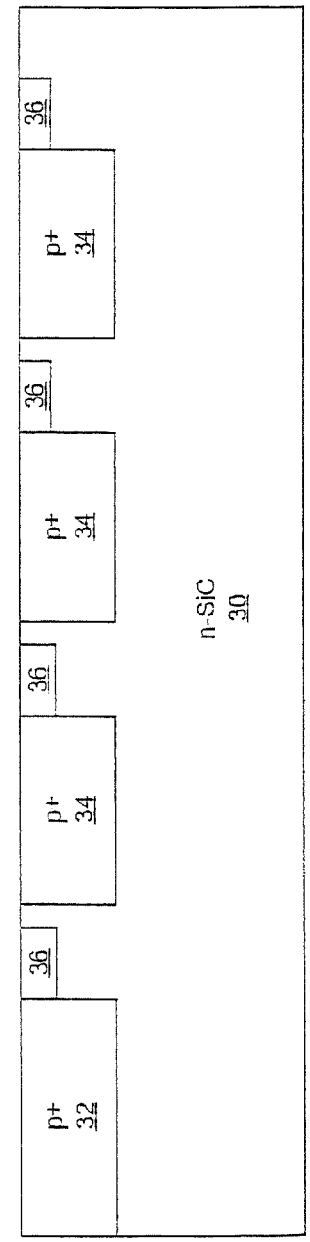
Figure 6E:
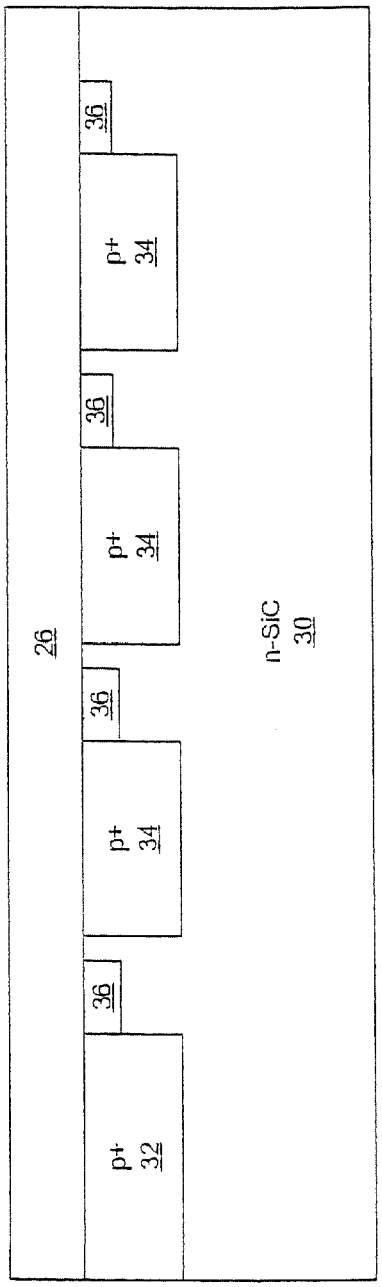

FIG. 6C illustrates the formation of the surface charge compensation regions 36 through ion implantation using the mask layer 100 as an ion implantation mask. The mask layer 100 may then be removed (FIG. 6D) and the insulating layer 26 formed on the resulting structure (FIG. 6E). The insulating layer 26 may, for example, be formed by thermal oxidation and/or depositing an oxide on the resulting structure.

Figure 6F:
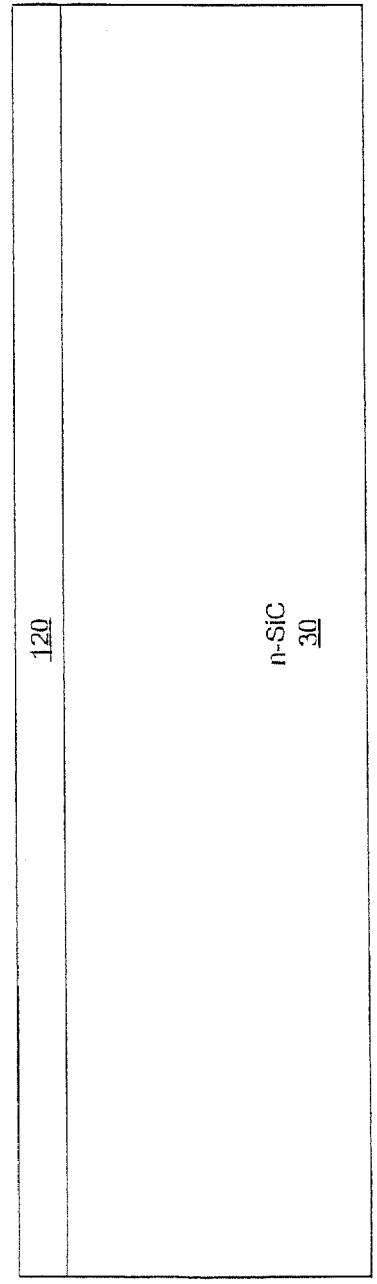
Figure 6I:
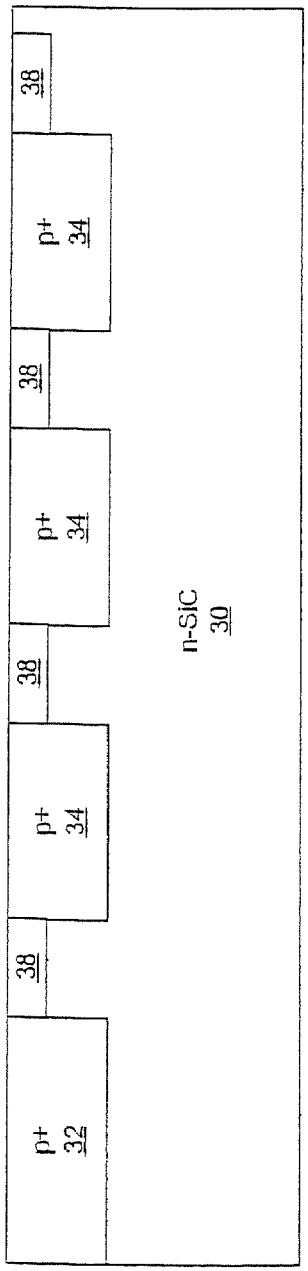

FIG. 6F illustrates methods of fabricating an edge termination structure according to further embodiments of the present invention. As seen in FIG. 6F, a silicon carbide layer 30 has formed on it a thin silicon carbide layer 120. The silicon carbide layer 120 may be an implanted layer and/or an epitaxial layer and may have a thickness and doping level as discussed above with reference to the surface charge compensation regions and/or layer.

Figure 6J:
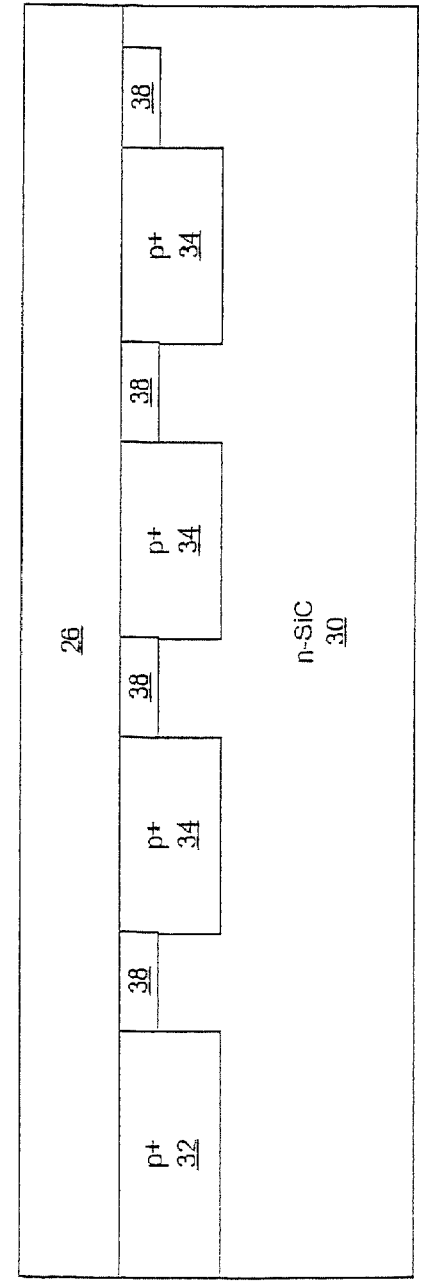
Figure 7A:
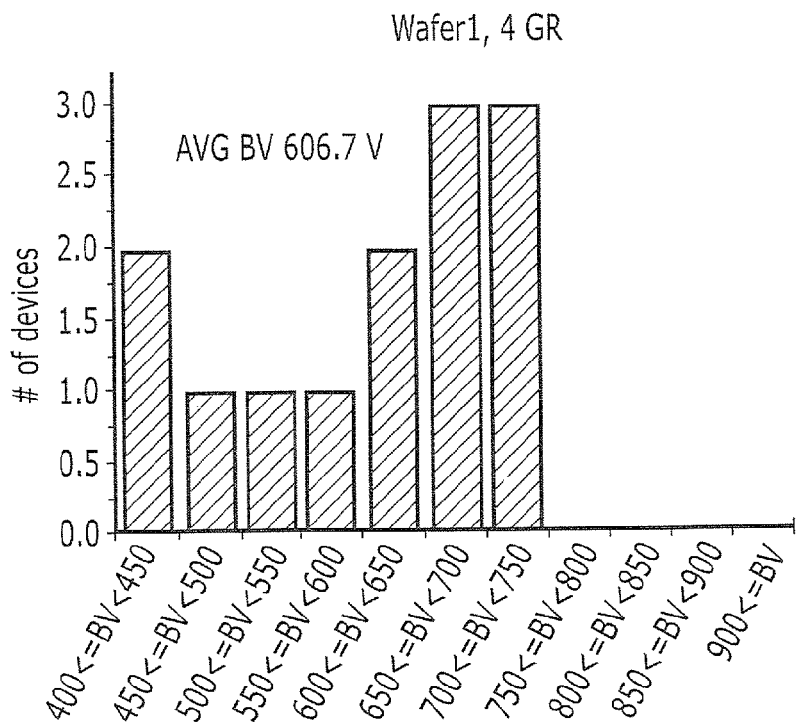
FIGS. 7A, 8A, 9A, 10A, 11A and 12A are distribution plots of breakdown voltages for Schottky devices having a four guard ring termination structure provided on six separate wafers.
Figure 7B:
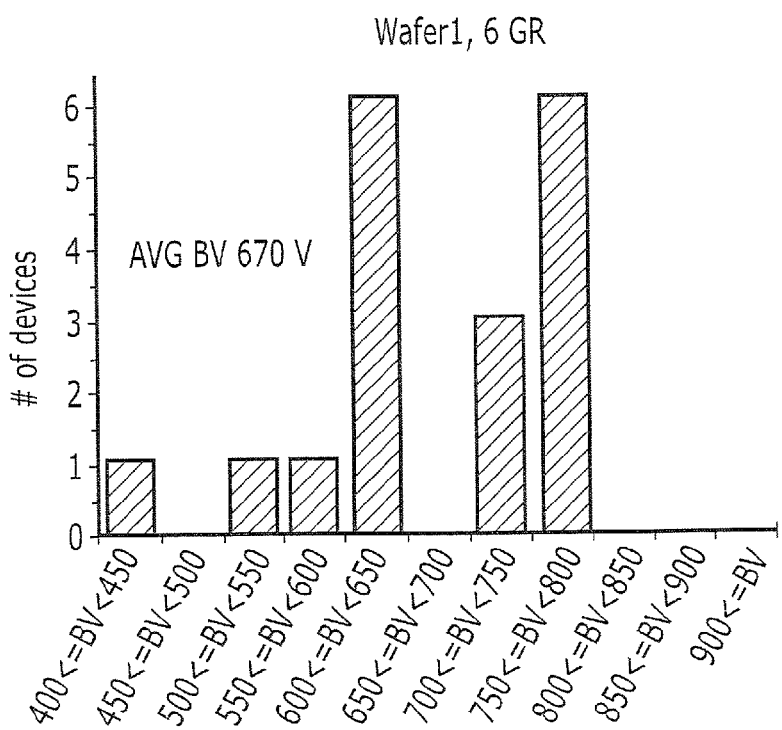
FIGS. 7B, 8B, 9B, 10B, 11B and 12B are distribution plots of breakdown voltages for Schottky devices having a six guard ring termination structure provided on six separate wafers.
Figure 7C:
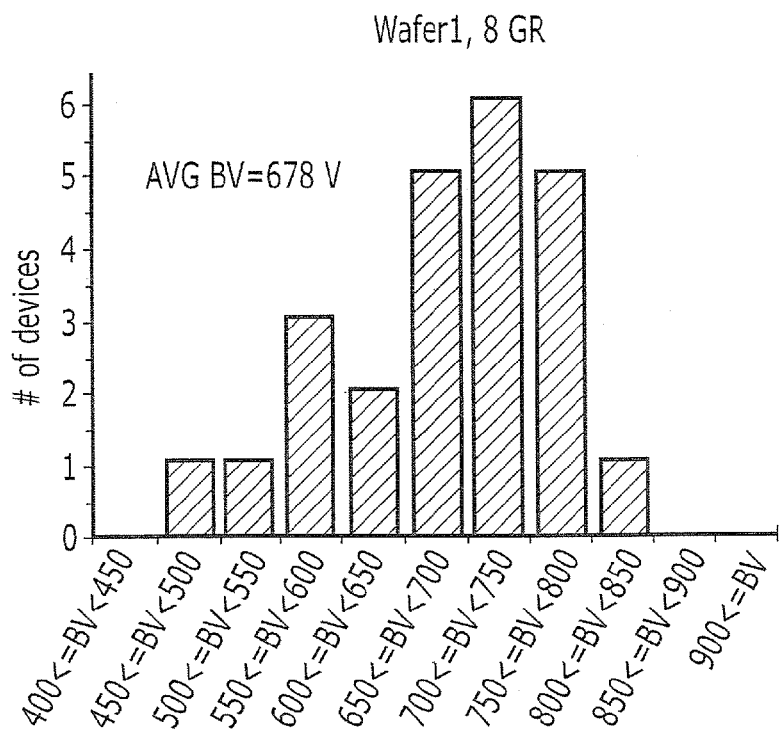
FIGS. 7C, 8C, 9C, 10C, 11C and 12C are distribution plots of breakdown voltages for Schottky devices having an eight guard ring termination structure provided on six separate wafers.
Figure 7D:
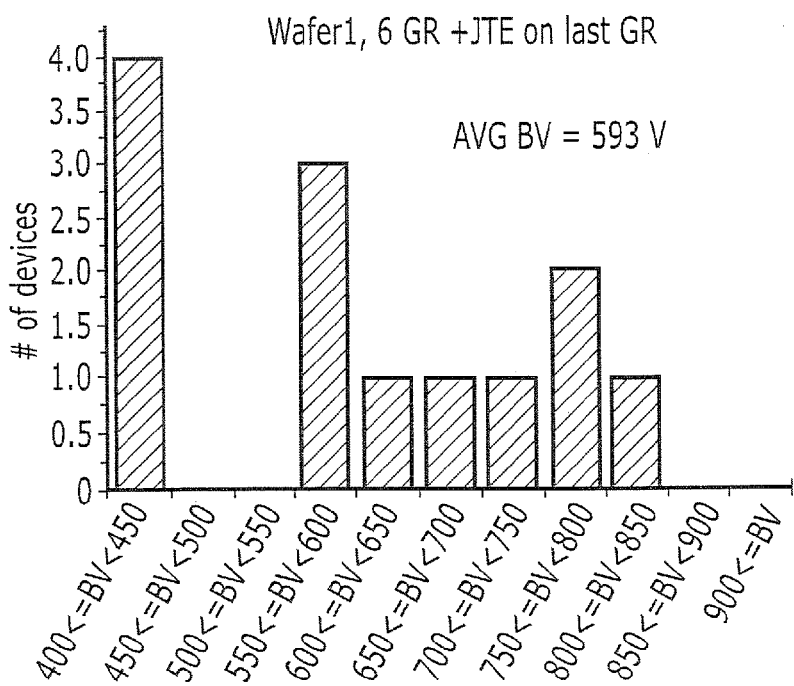
FIGS. 7D, 8D, 9D, 10D, 11D and 12D are distribution plots of breakdown voltages for Schottky devices having an eight guard ring with a JTE at the last guard ring termination structure provided on six separate wafers.
Figure 7E:
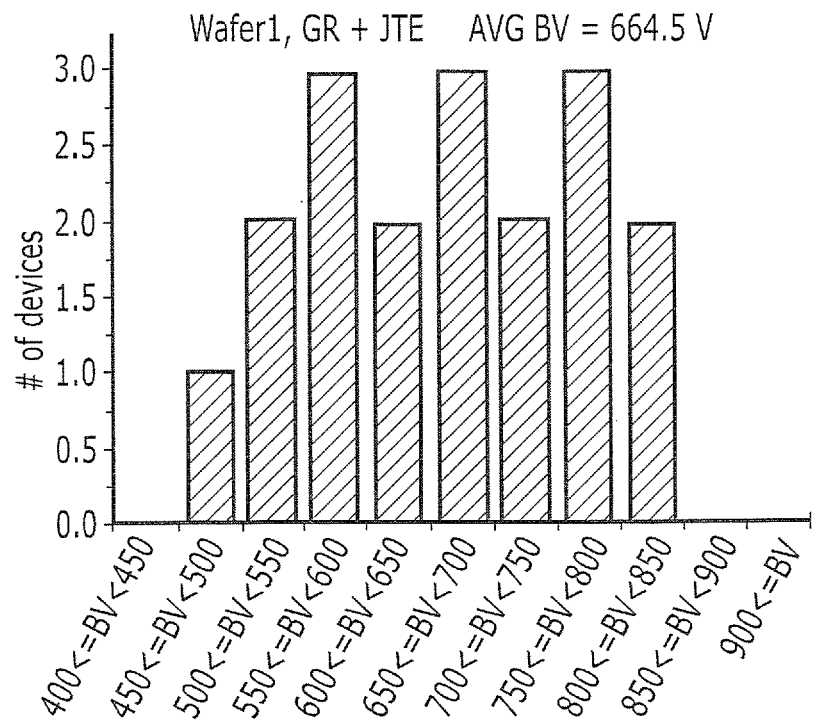
FIGS. 7E, 8E, 9E, 10E, 11E and 12E are distribution plots of breakdown voltages for Schottky devices having a guard ring and JTE termination structure provided on six separate wafers similar to that described in Kinoshita et al., "Guard Ring Assisted RESURF: A New Termination Structure Providing Stable and High Breakdown Voltage for SiC Power Devices," *Tech. Digest of ISPSD* '02, pp. 253-256 (the Japan Paper)
Figure 7F:
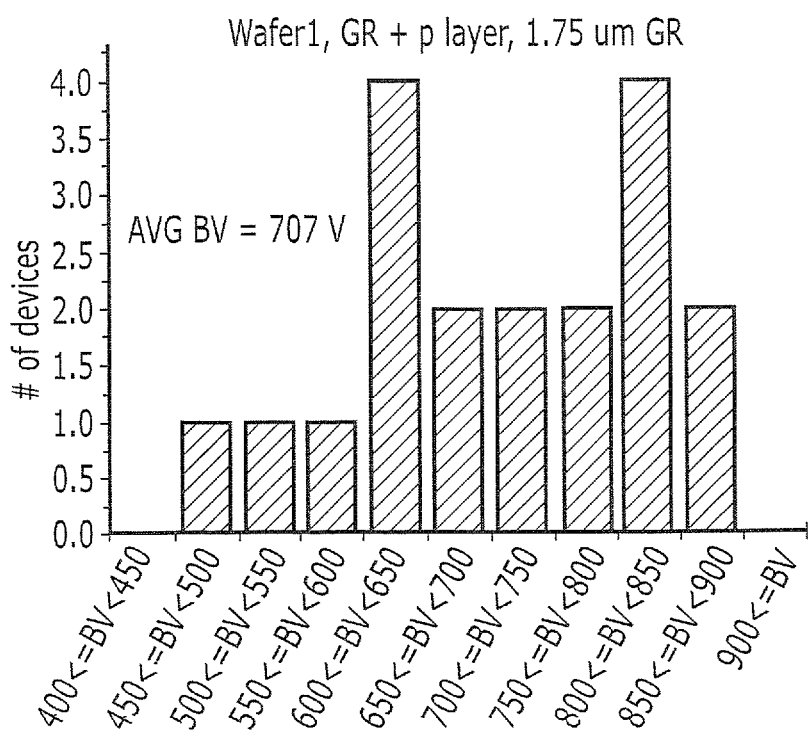
FIGS. 7F, 8F, 9F, 10F, 11F and 12F are distribution plots of breakdown voltages for Schottky devices having a 1.75 µm guard ring with a charge compensation layer termination structure provided on six separate wafers.
Figure 7G:
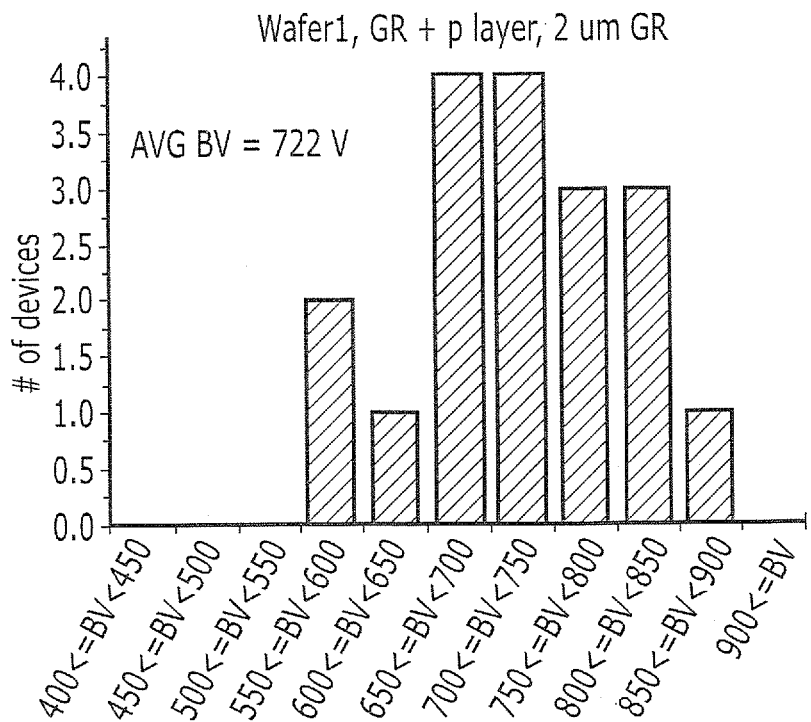
FIGS. 7G, 8G, 9G, 10G, 11G and 12G are distribution plots of breakdown voltages for Schottky devices having a 2.0 µm guard ring with a charge compensation layer termination structure provided on six separate wafers.
Figure 7H:
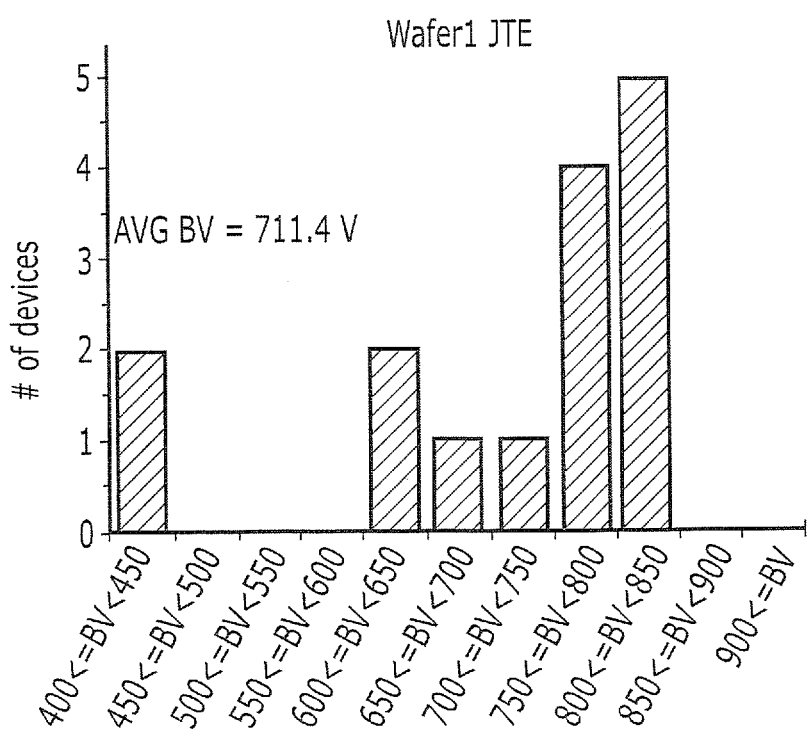
FIGS. 7H, 8H, 9H, 10H, 11H and 12H are distribution plots of breakdown voltages for Schottky devices having a JTE termination structure provided on six separate wafers.
Figure 8A:
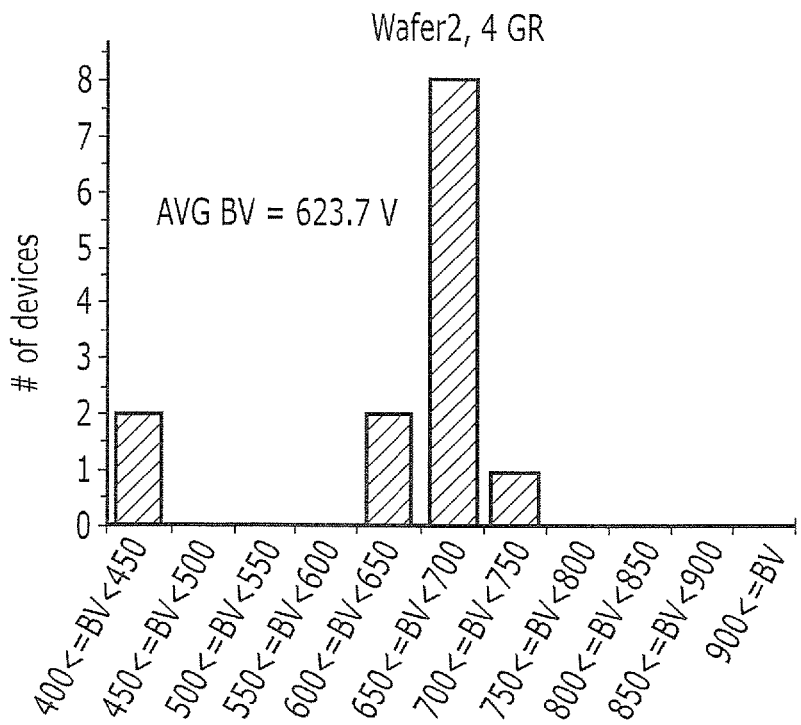
Figure 8B:
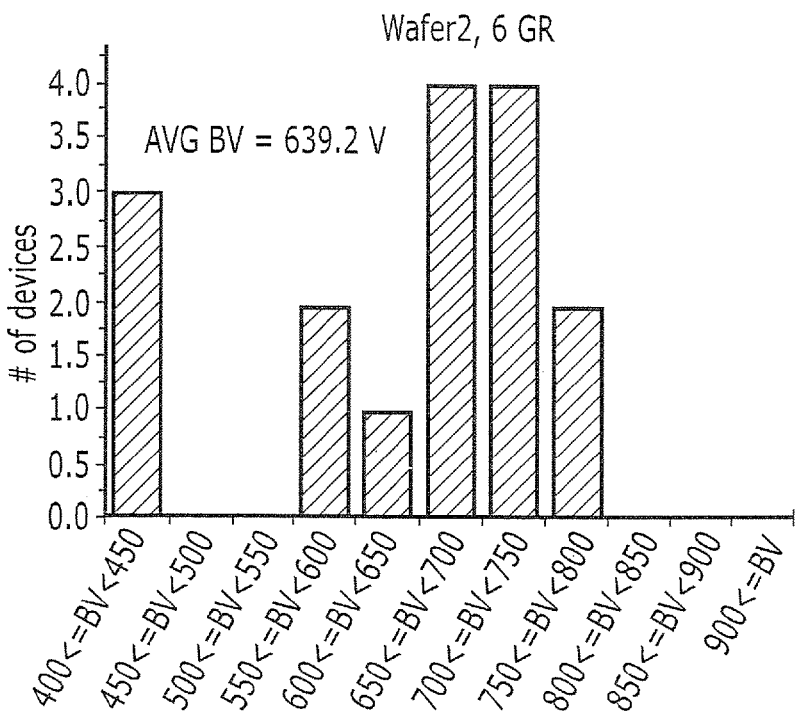
Figure 8C:
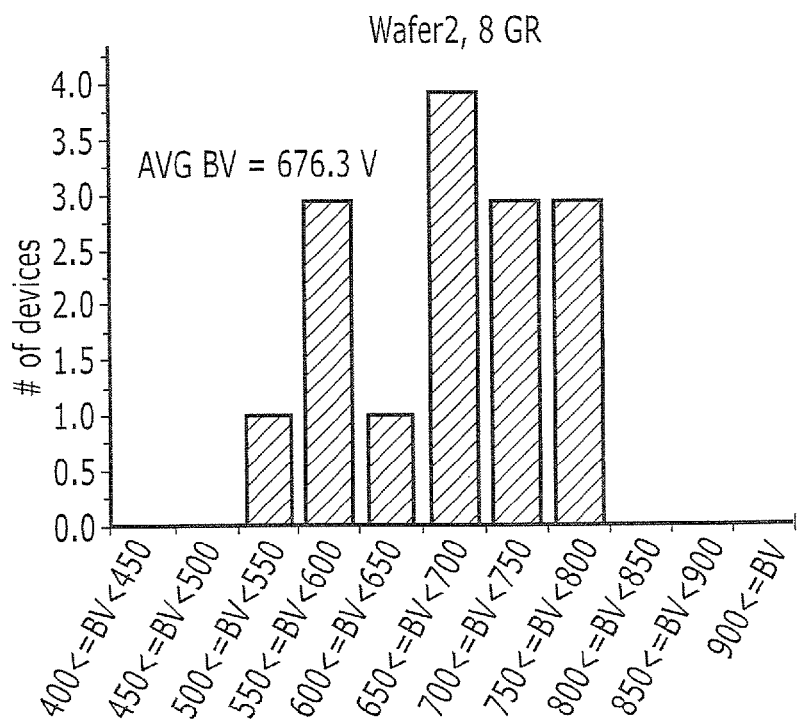
Figure 8D:
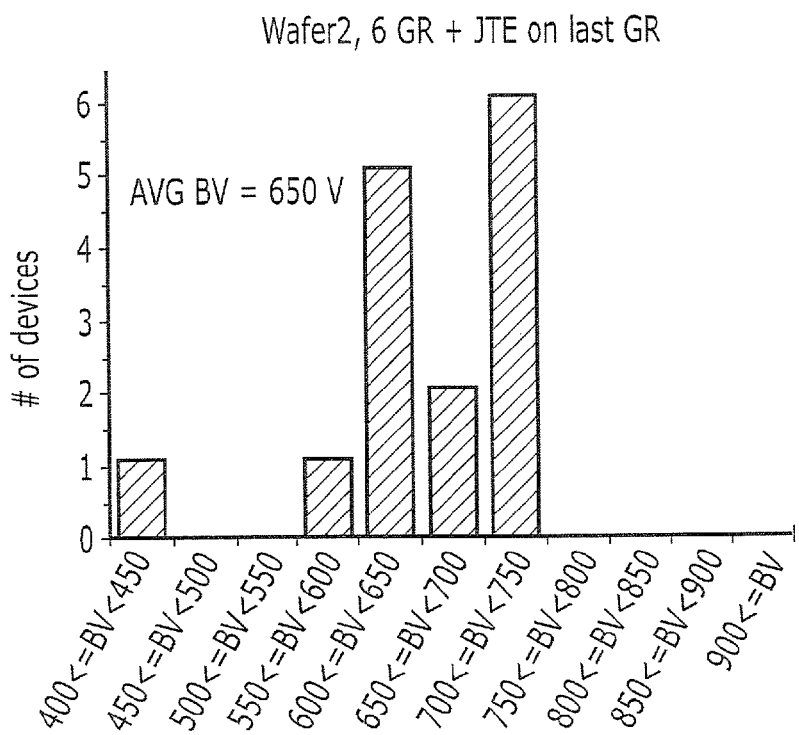
Figure 8E:
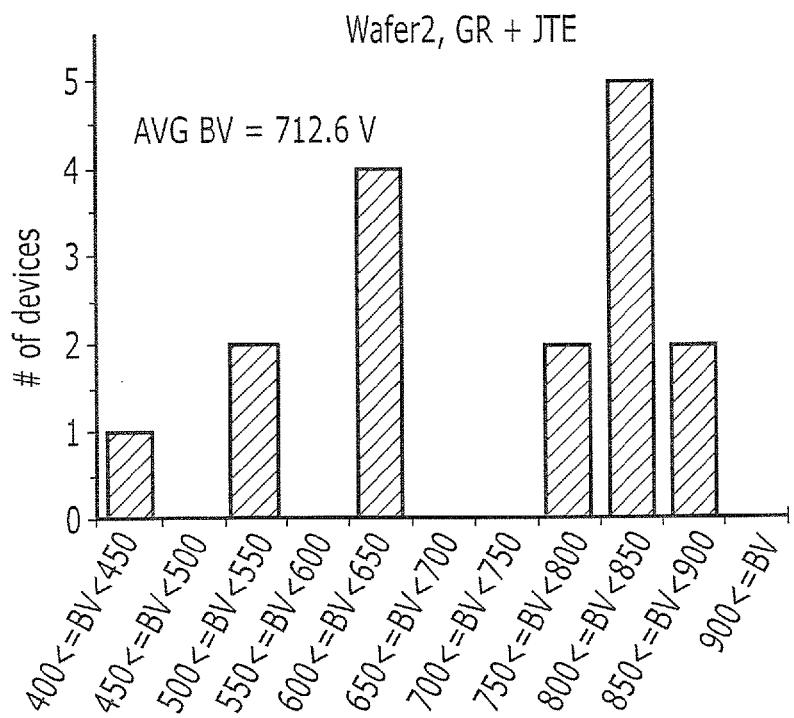
Figure 8F:
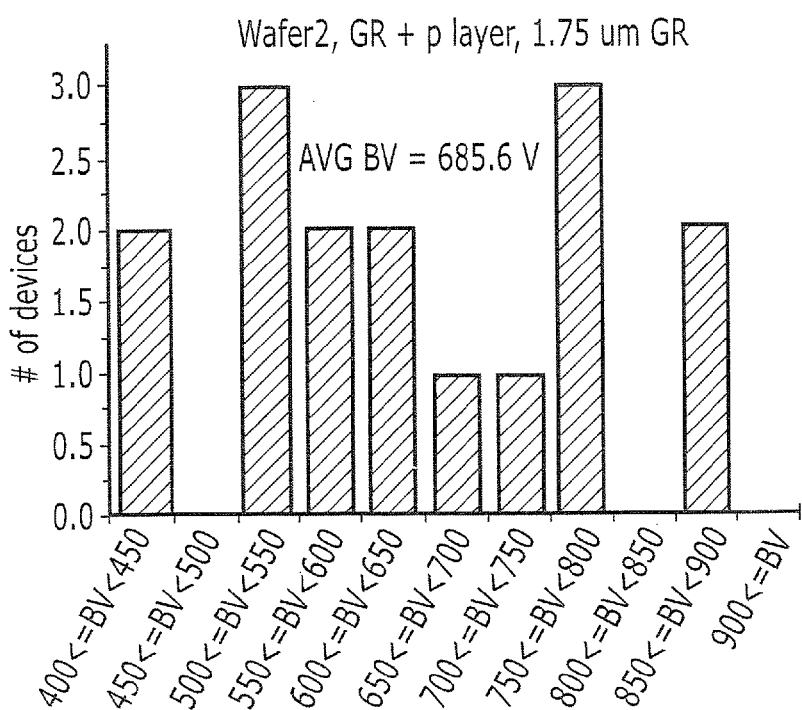
Figure 8G:
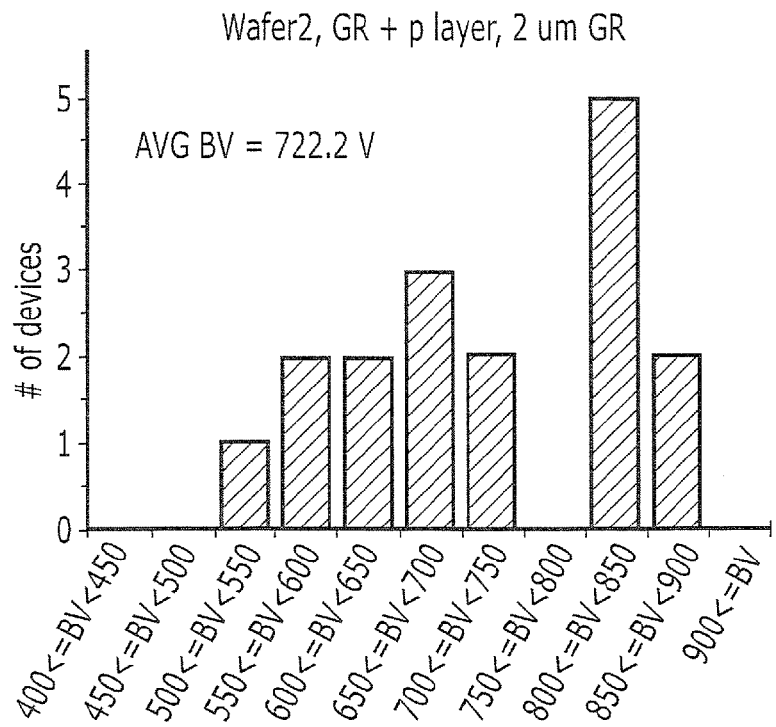
Figure 8H:
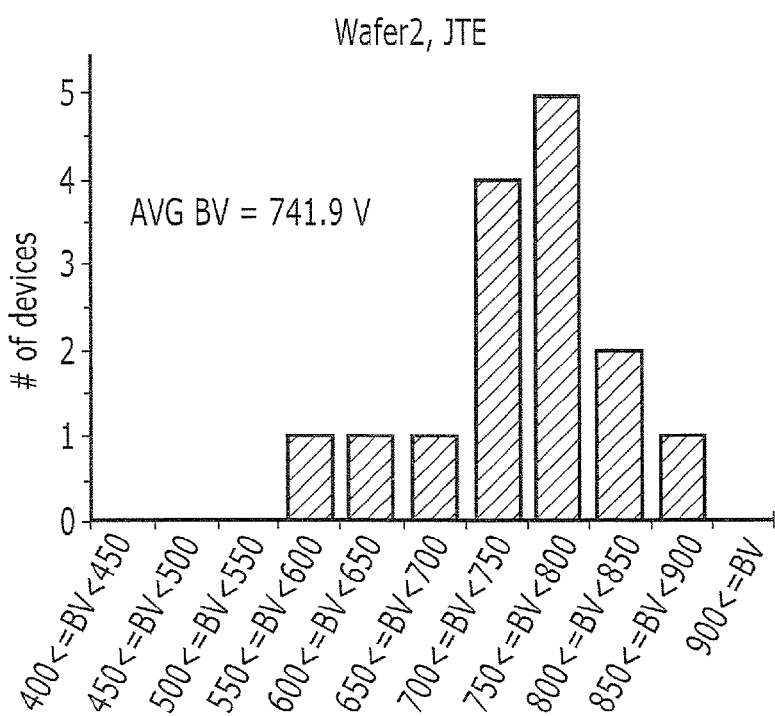
Figure 9A:
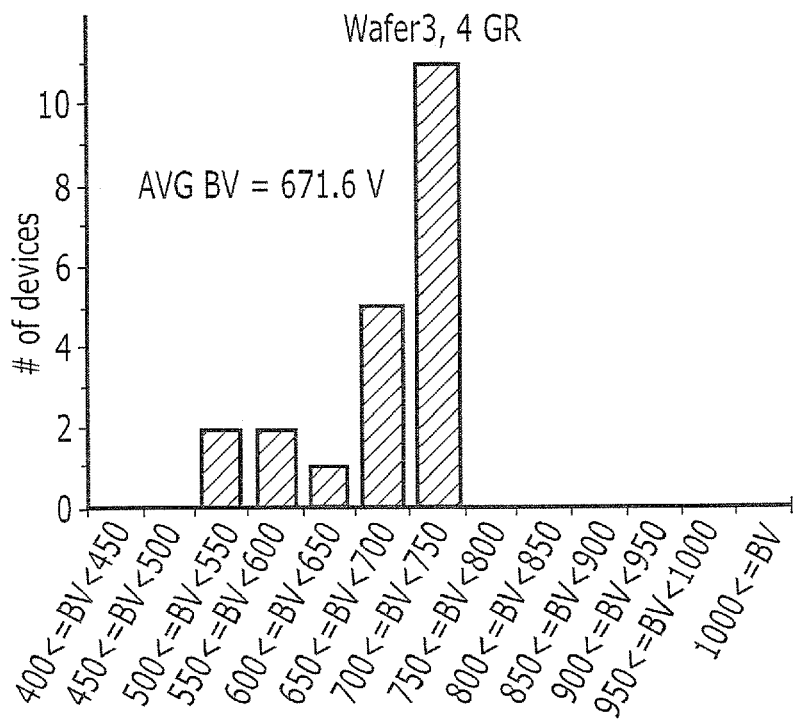
Figure 9B:
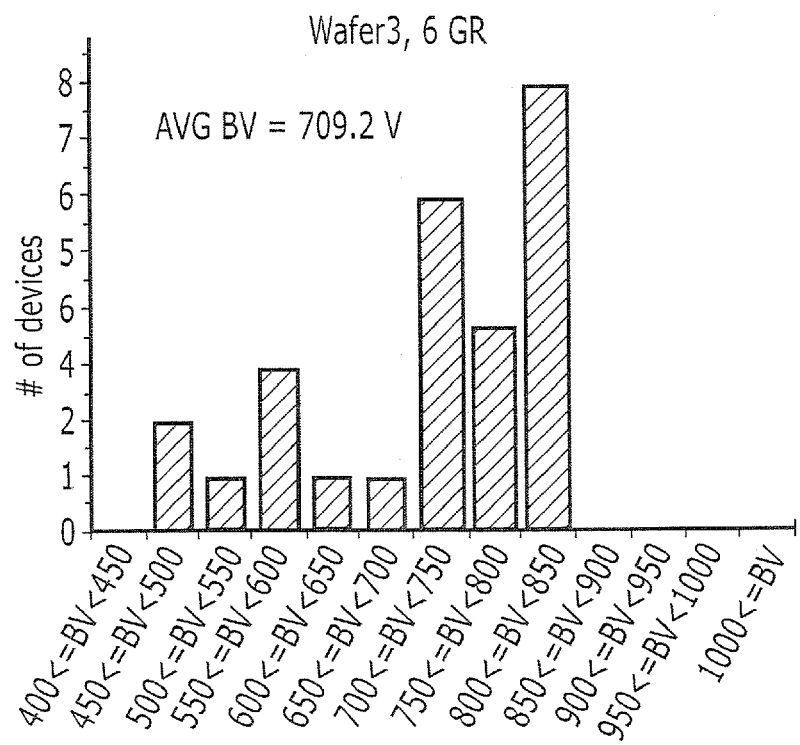
Figure 9C:
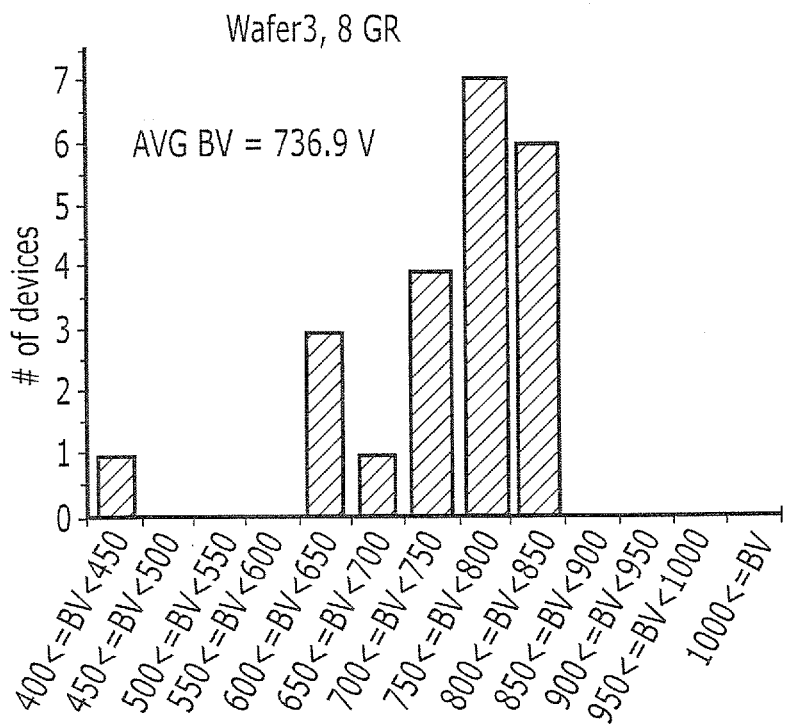
Figure 9D:
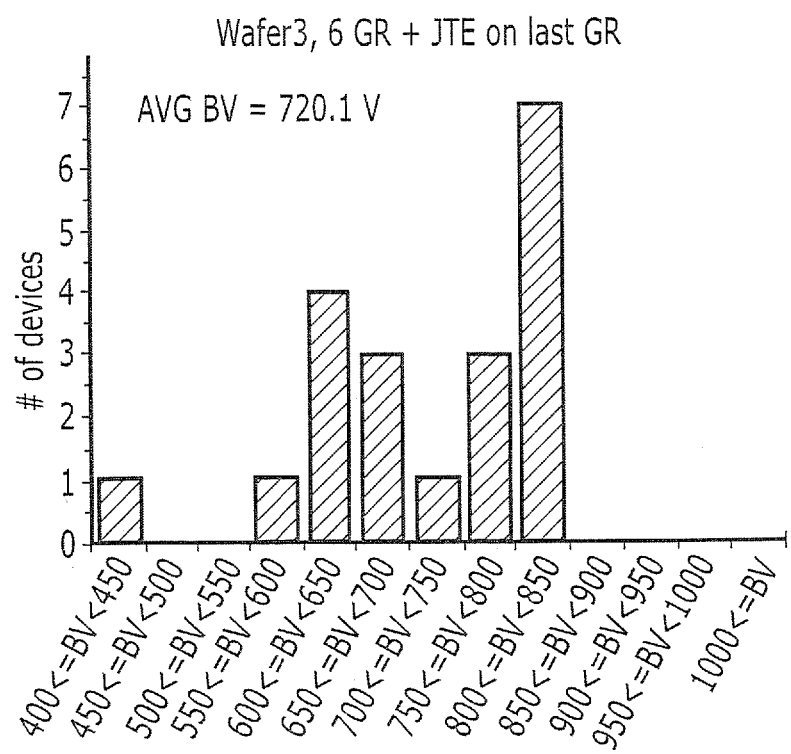
Figure 9E:
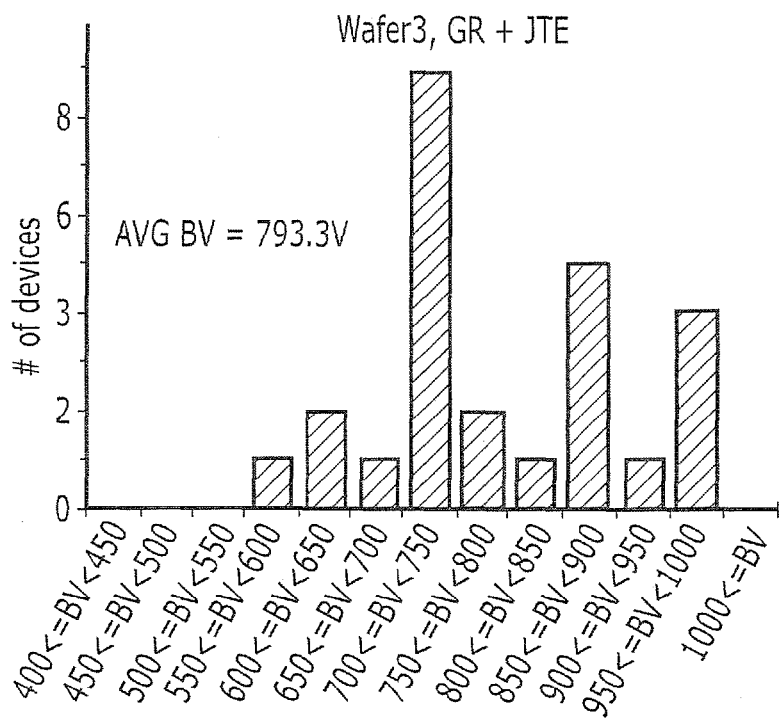
Figure 9F:
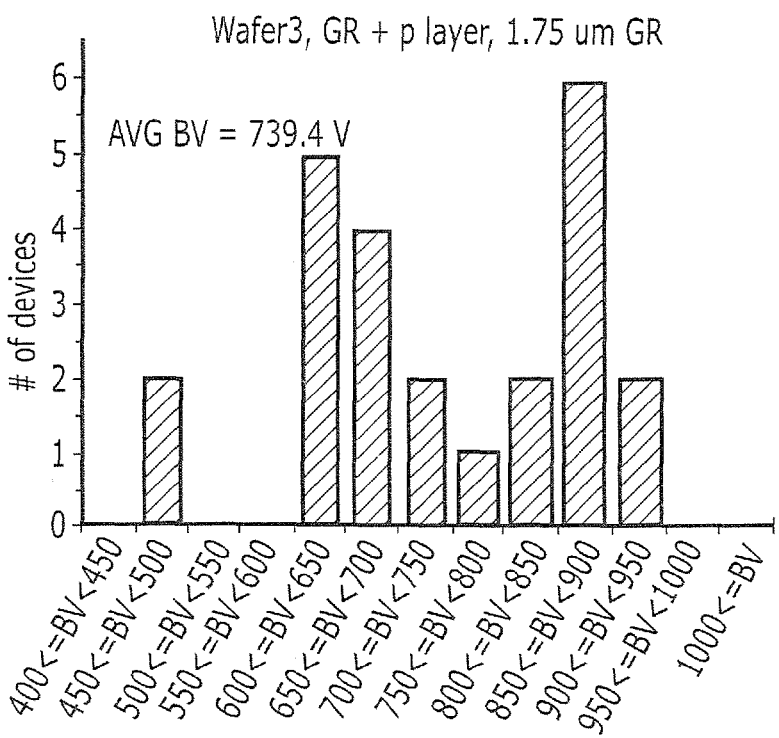
Figure 9G:
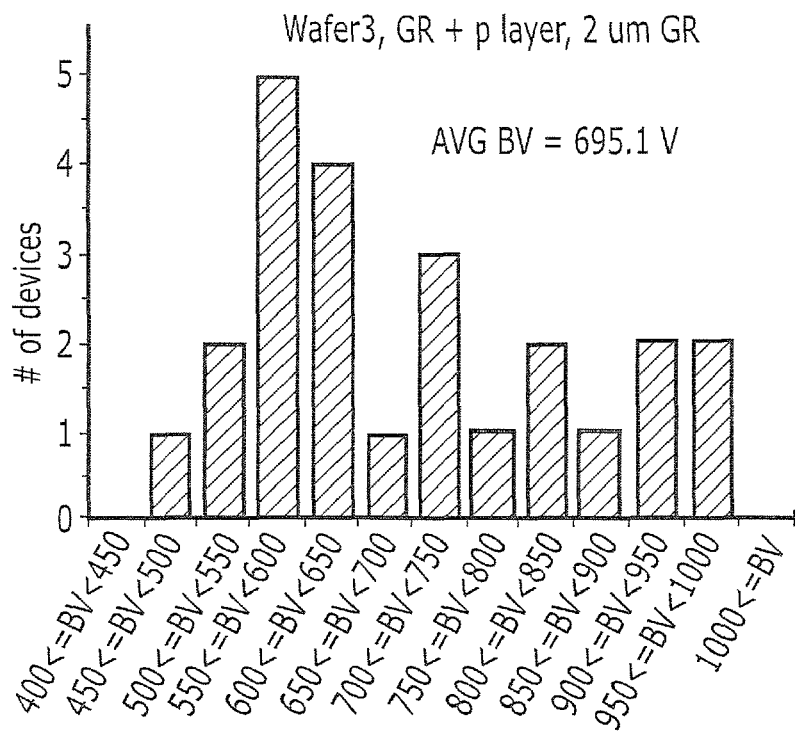
Figure 9H:
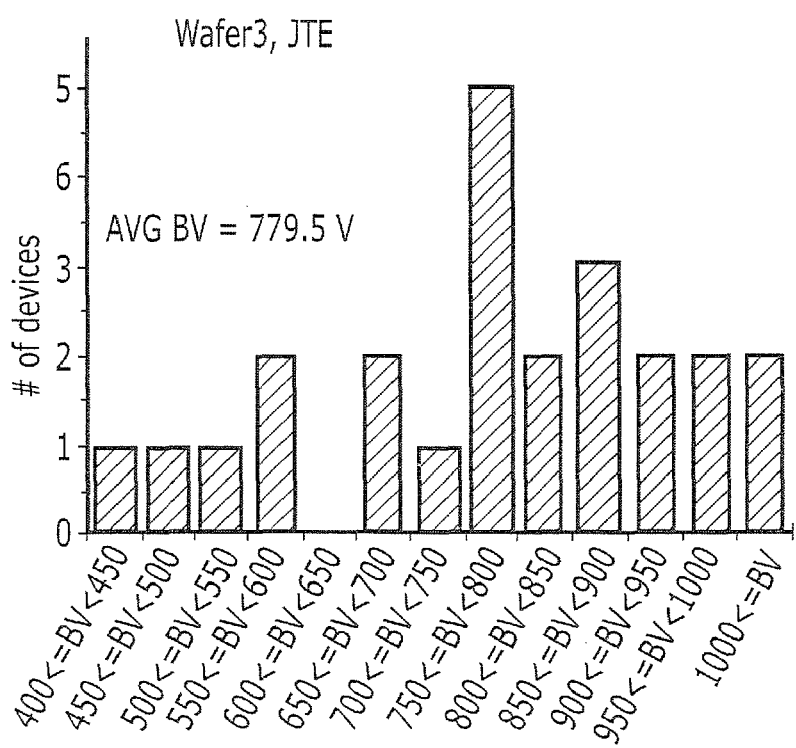
Figure 10A:
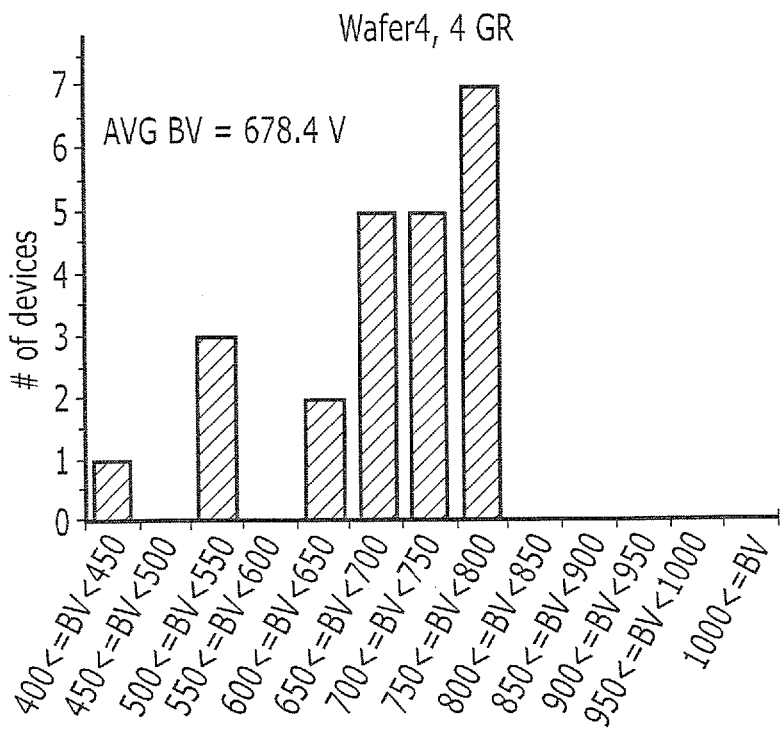
Figure 10B:
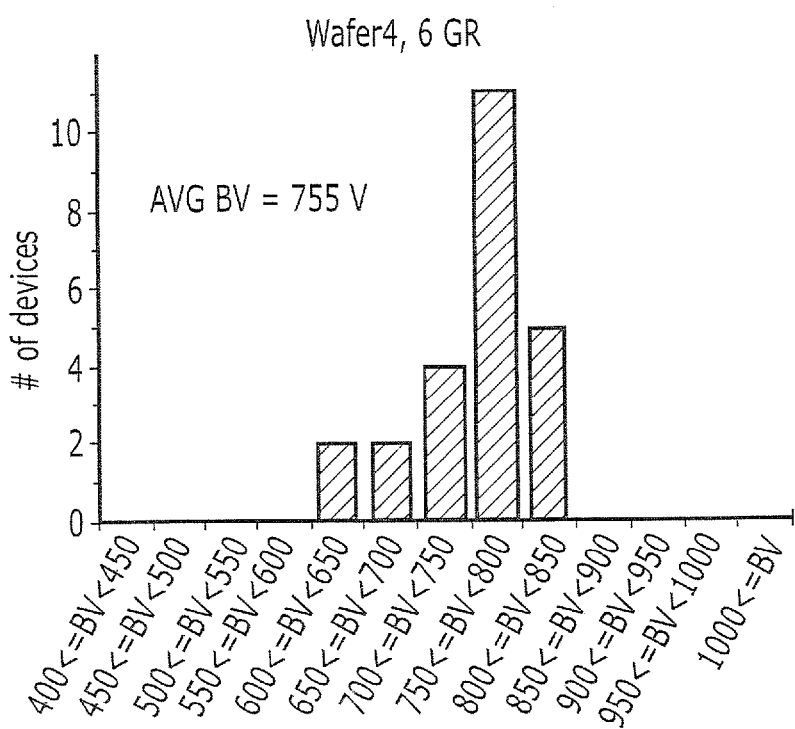
Figure 10C:
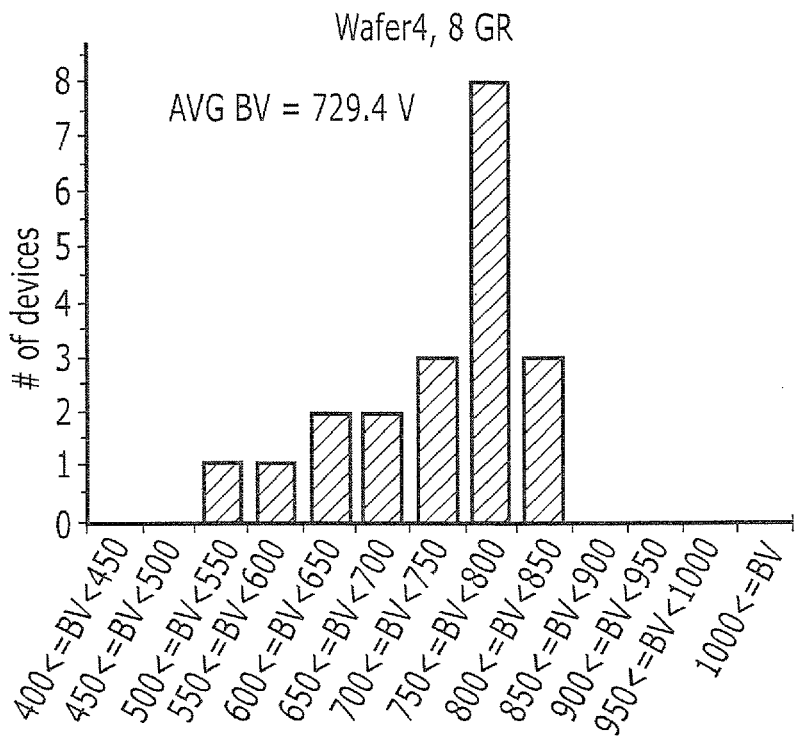
Figure 10D:
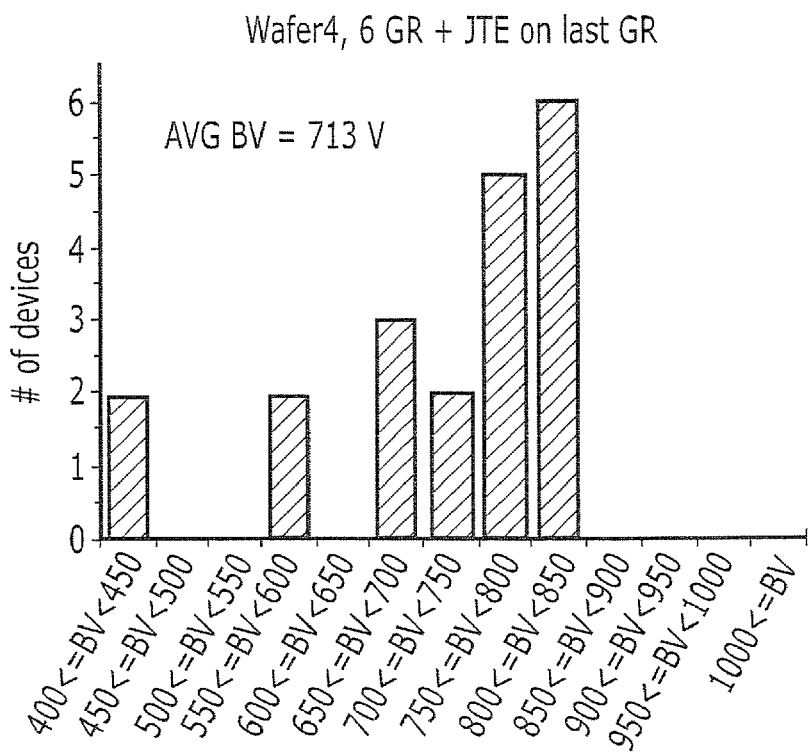
Figure 10E:
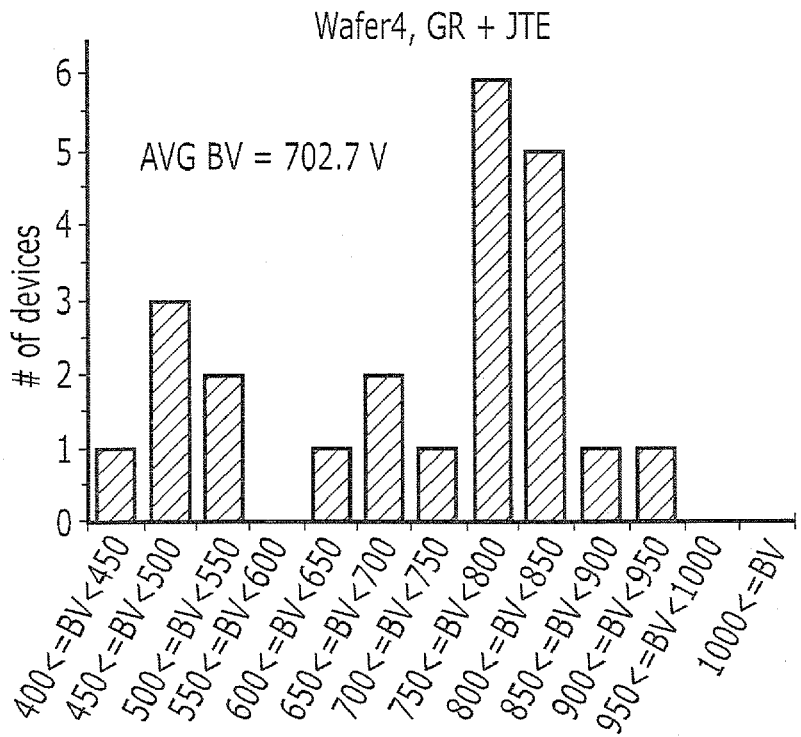
Figure 10F:
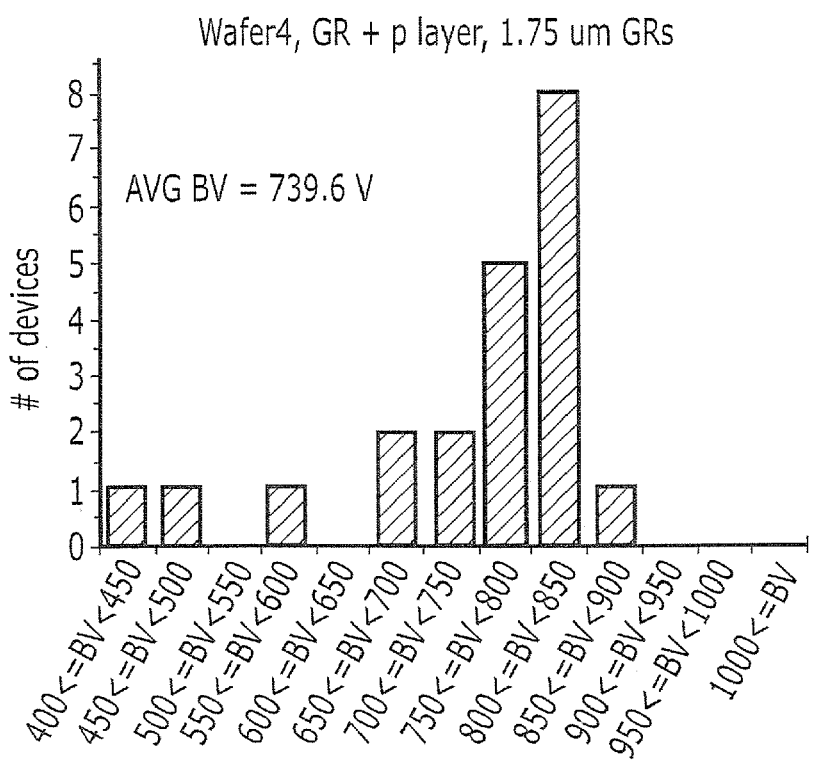
Figure 10G:
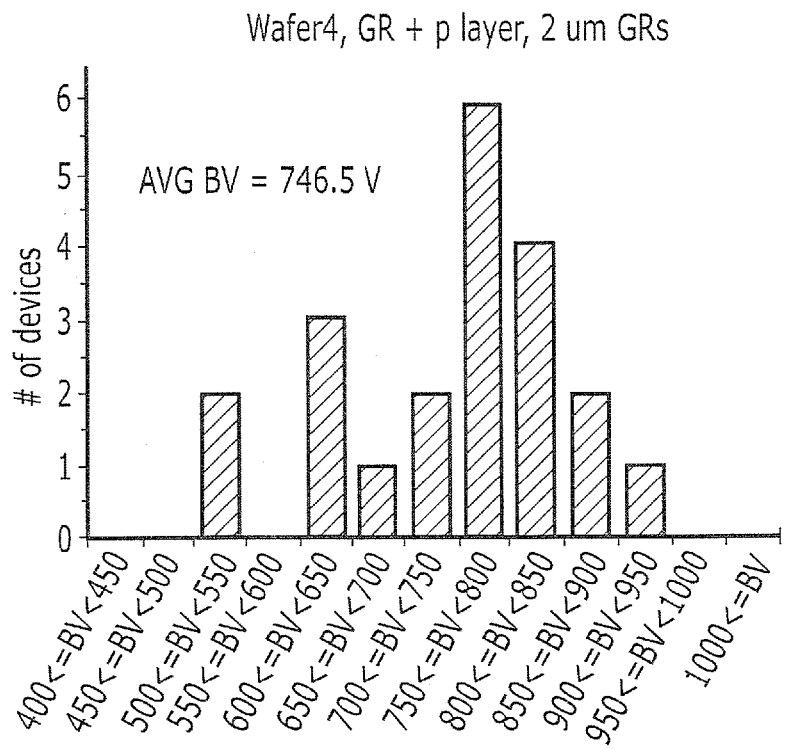
Figure 10H:
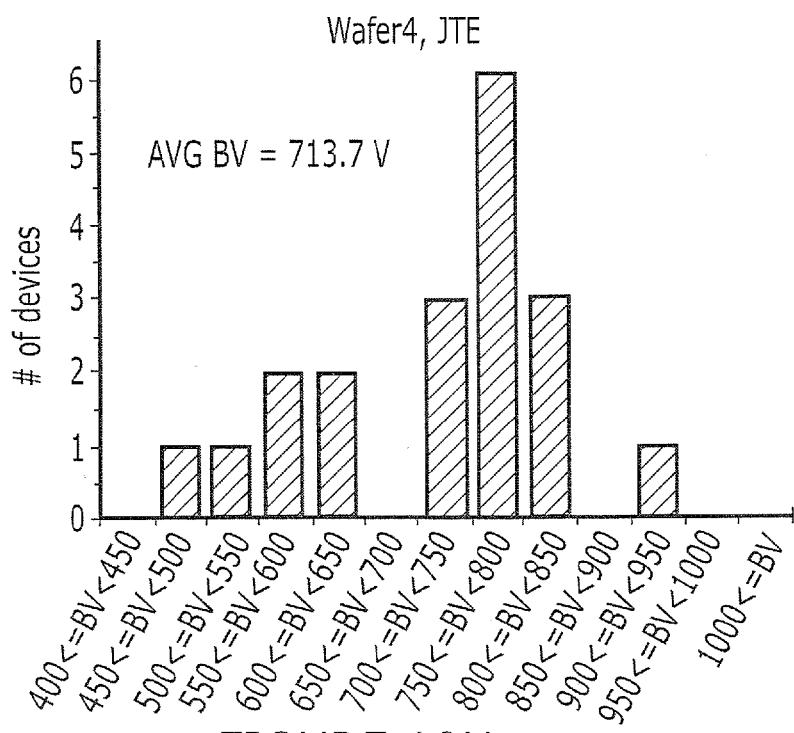
Figure 11A:
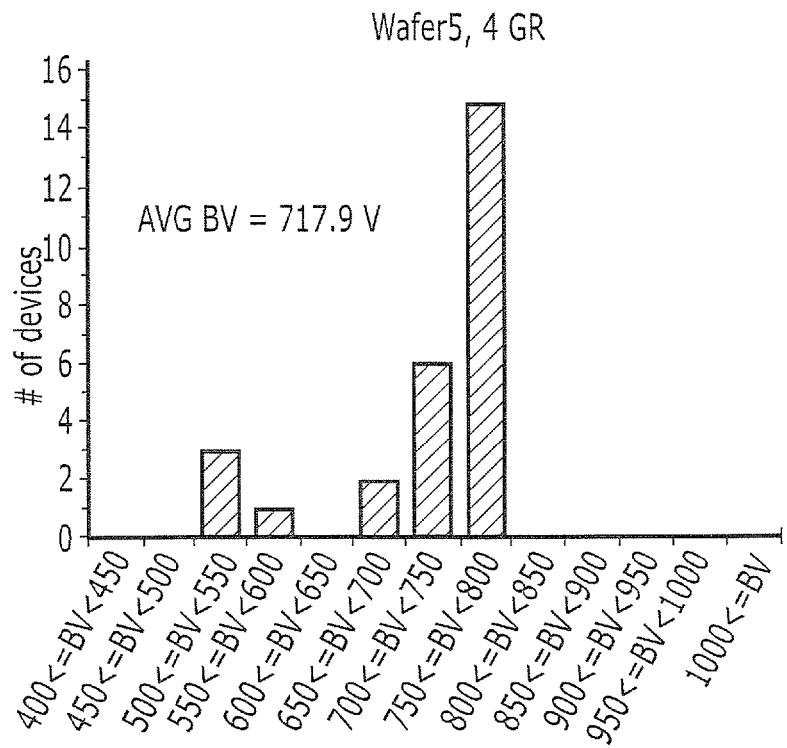
Figure 11B:
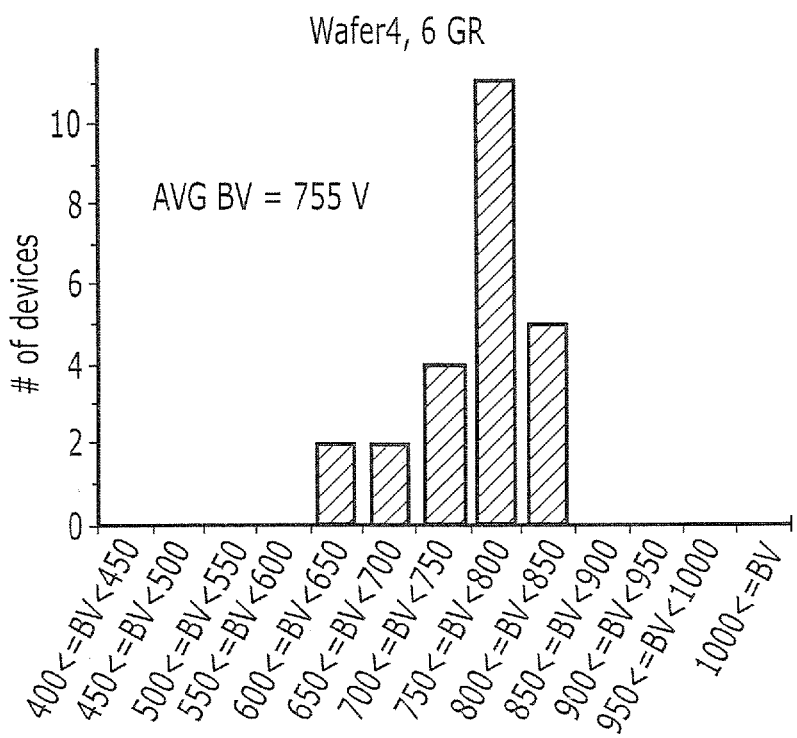
Figure 11C:
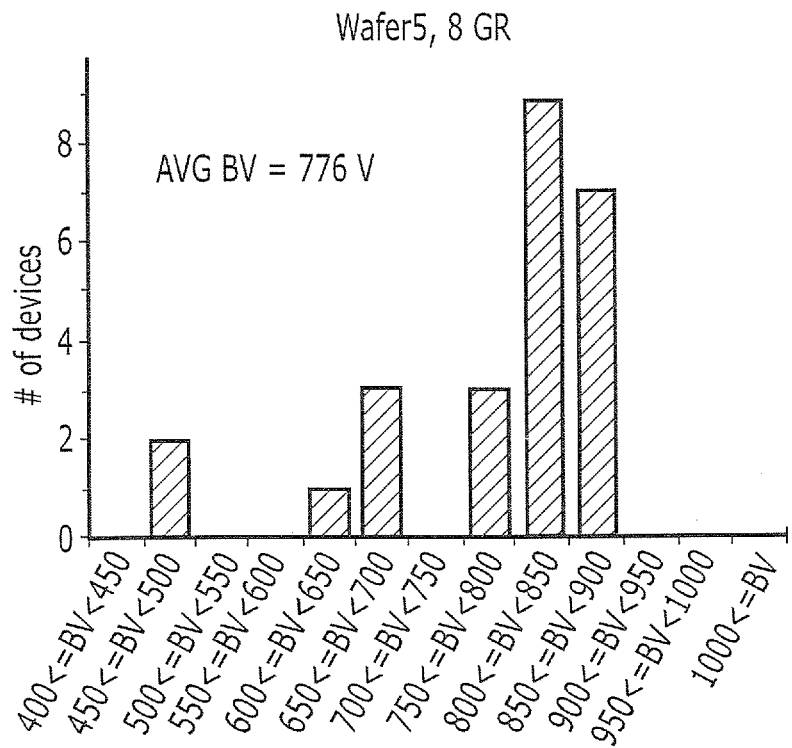
Figure 11D:
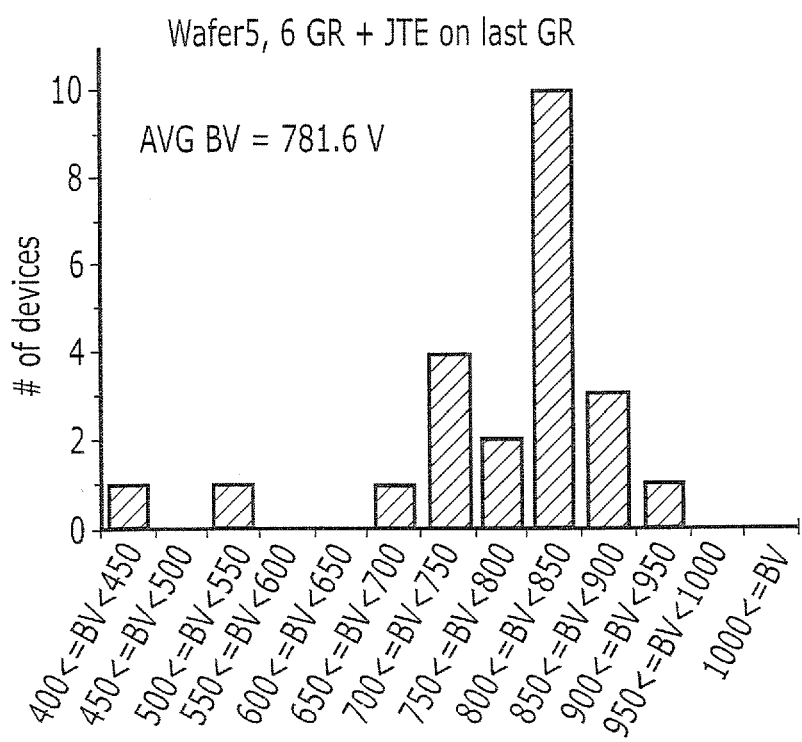
Figure 11E:
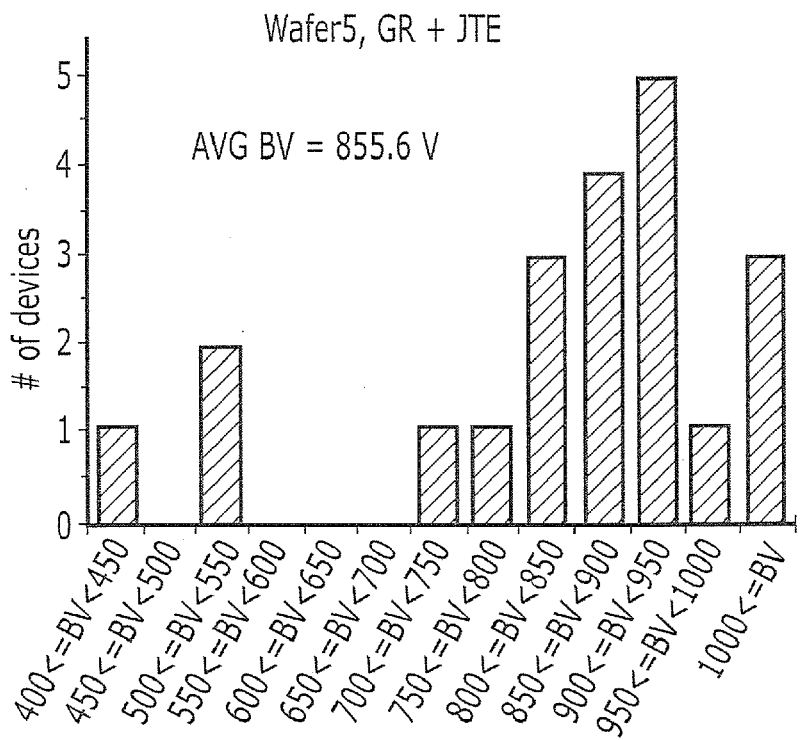
Figure 11F:
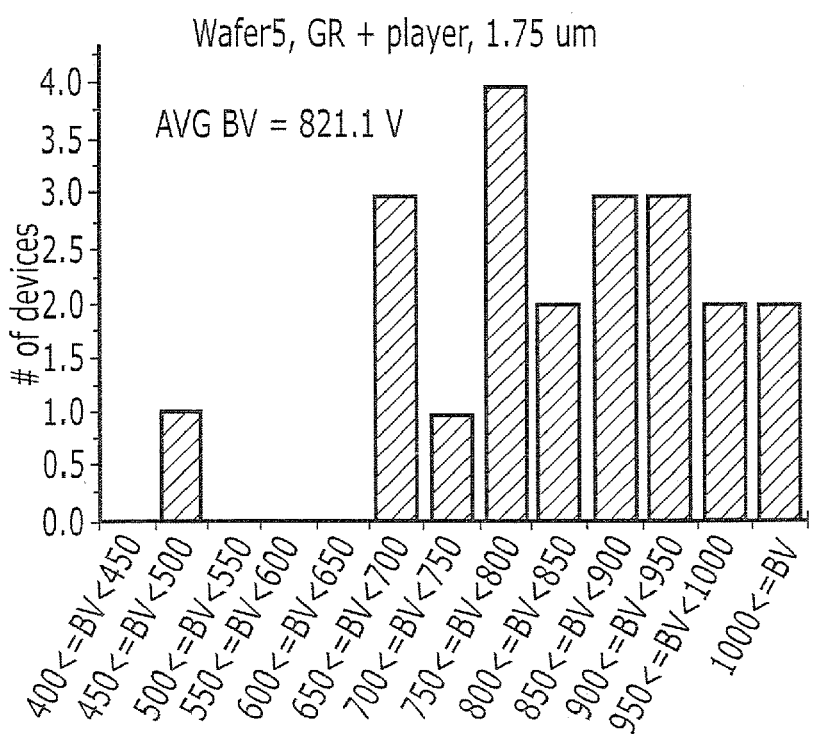
Figure 11G:
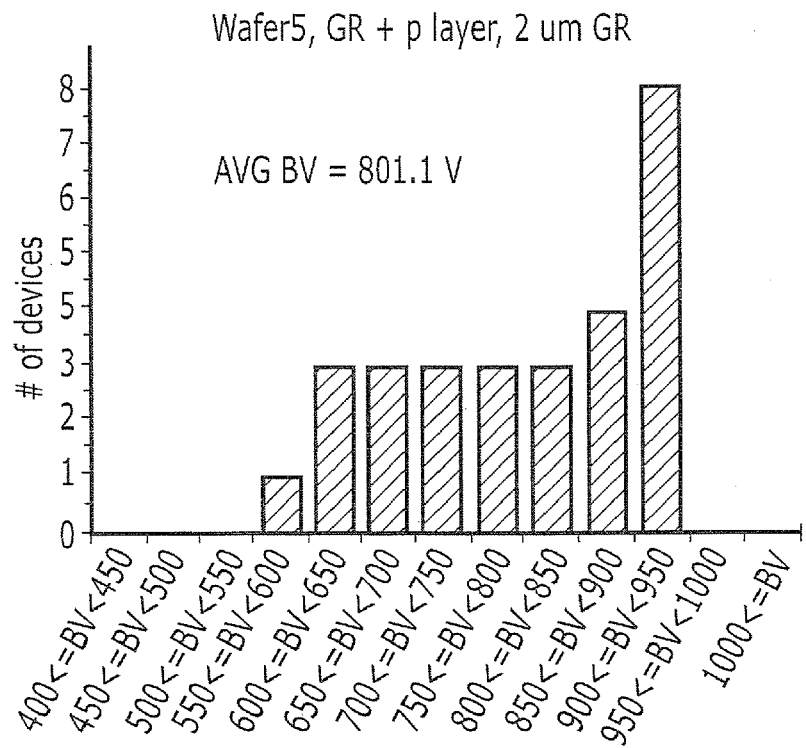
Figure 11H:
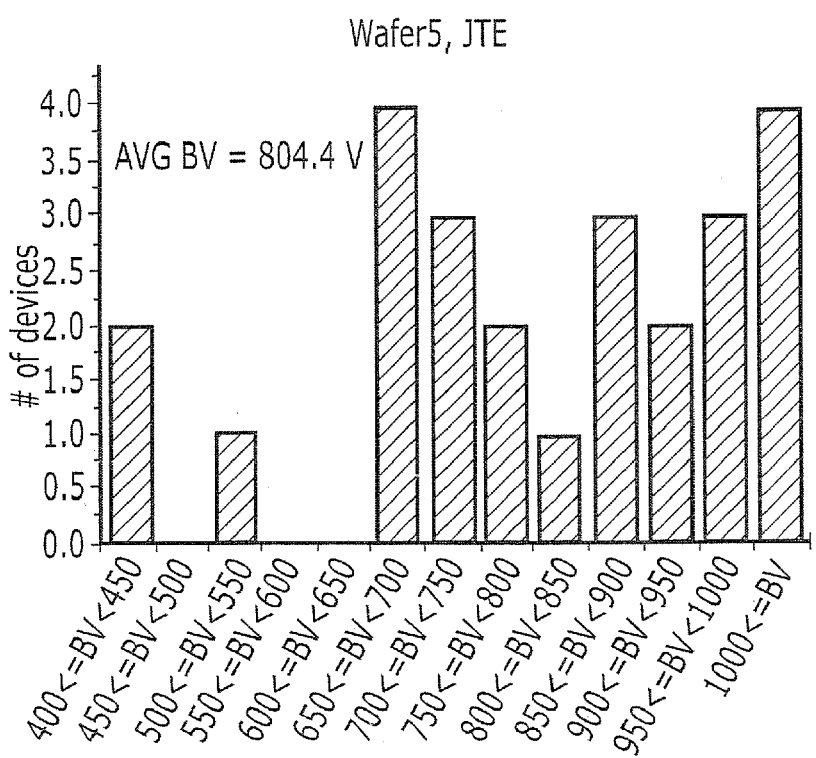
Figure 12A:
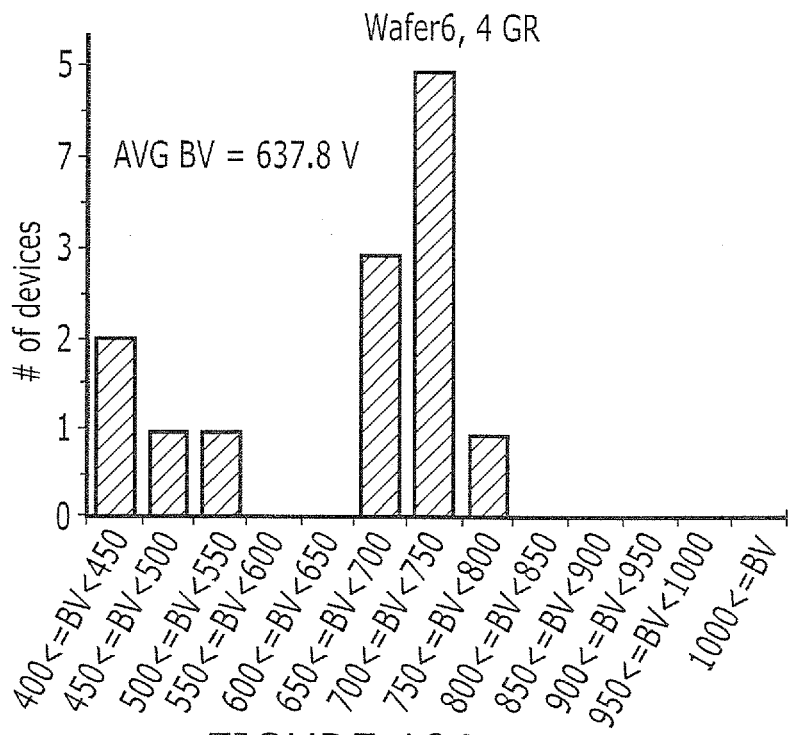
Figure 12B:
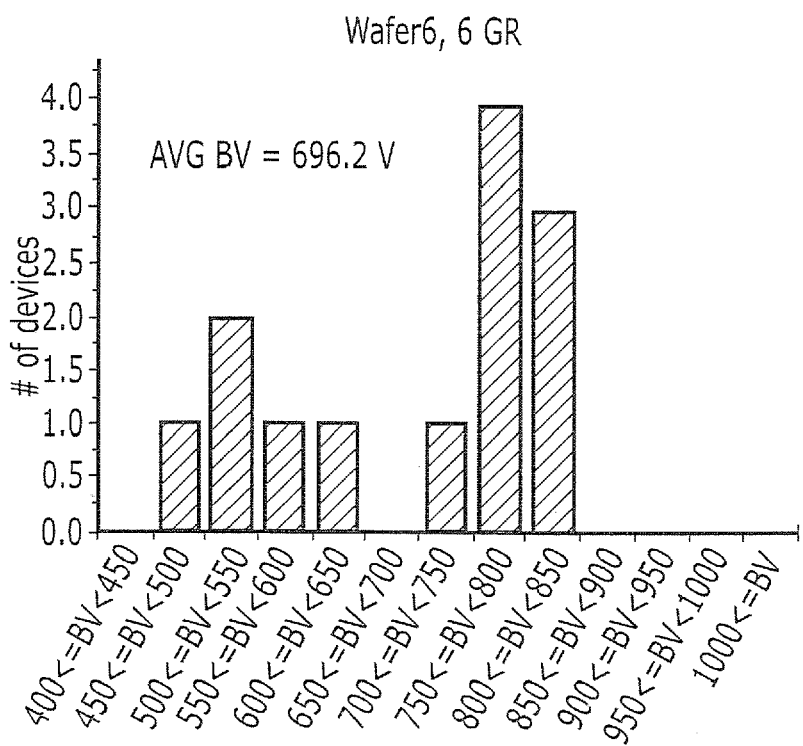
Figure 12C:
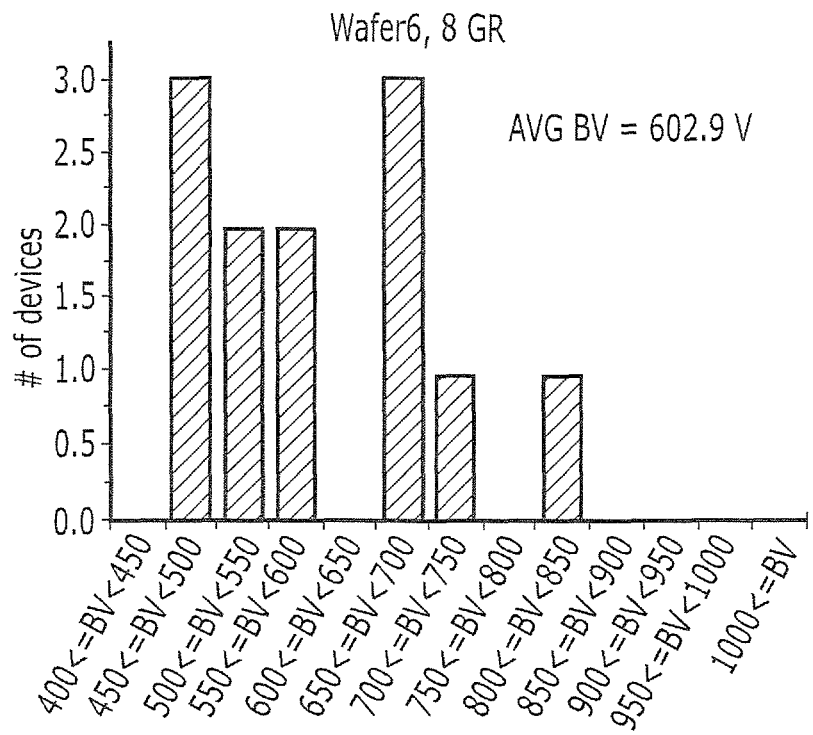
Figure 12D:
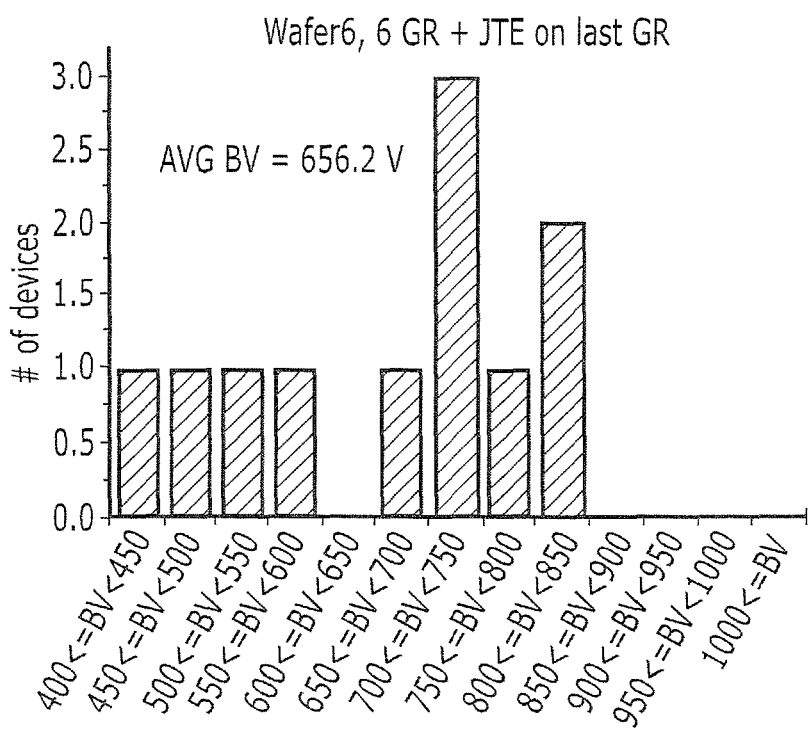
Figure 12E:
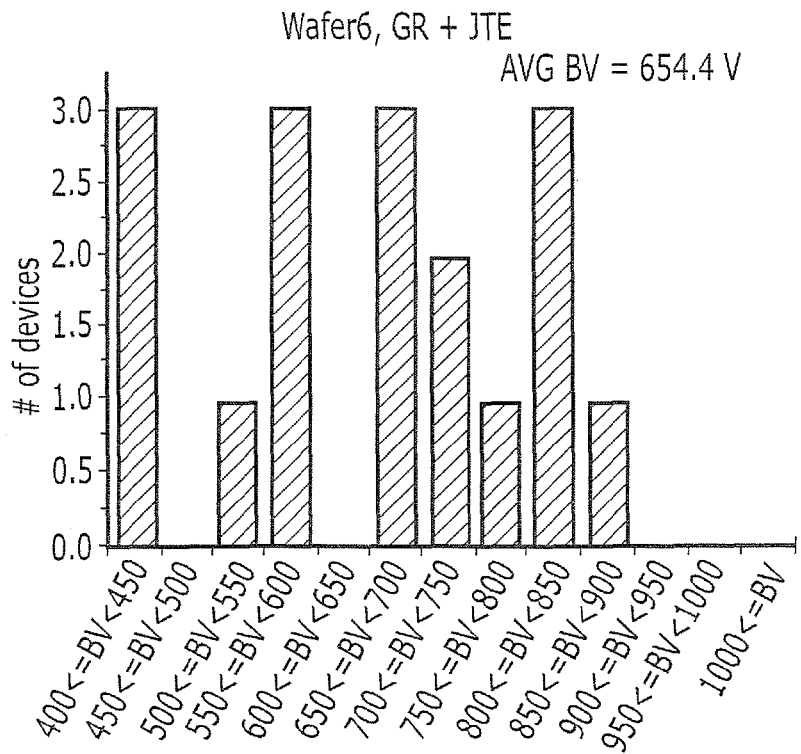
Figure 12F:
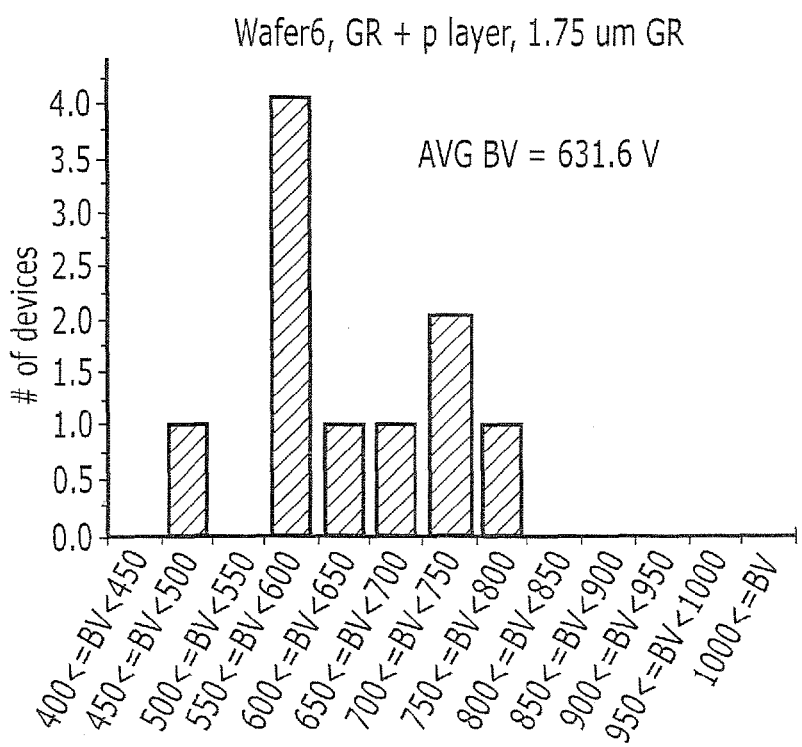
Figure 12G:
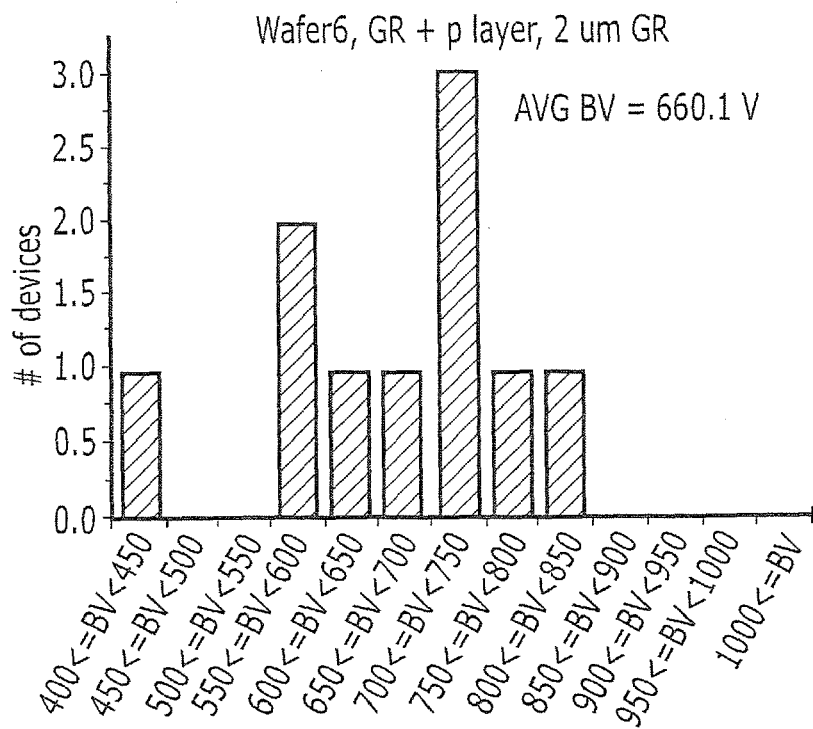
Figure 12H:
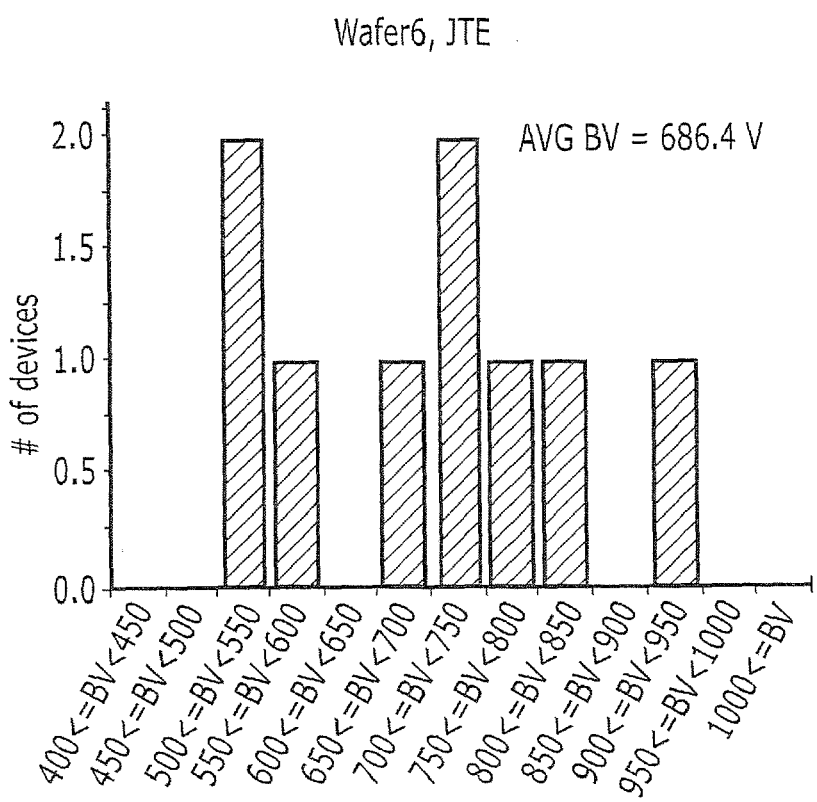

FIG. 6G illustrates the formation and patterning of a mask layer 140. The mask layer 140 may be formed utilizing conventional masking techniques and corresponds to the surface charge compensation regions. The windows in the mask may correspond to the junction 32 and/or guard rings 34. Utilizing the mask layer 140 as an ion implantation mask, ions are implanted in the silicon carbide layer 30 to provide the junction 32 and/or the guard rings 34 (FIG. 6H). The mask layer 140 may then be removed (FIG. 6I) and the insulating layer 26 formed on the resulting structure (FIG. 6J). The insulating layer 26 may, for example, be formed by thermal oxidation and/or depositing an oxide on the resulting structure.

While embodiments of the present invention have been described with reference to particular operations in fabrication, particular mask patterns and the like, as will be appreciated by one of skill in the art in light of the present disclosure, other operations, sequences of operations, mask patterns and the likes may be utilized while still benefiting from the teachings of the present invention. For example, a different sequence of implantation of guard rings and surface charge compensation regions may be provided. Furthermore, the particular operations in fabrication of the device may depend on the device being fabricated. Thus, for example, the fabrication of a transistor may have different fabrication steps than the fabrication of a diode. Accordingly, embodiments of the present invention should not be construed as limited to particular operations in fabrication but may encompass and fabrication operations that provide edge termination structures as described herein.

EXAMPLES

The following examples are illustrative of particular embodiments of the present invention and should not be construed as limiting embodiments of the present invention.

Schottky diodes with a 1.58 mm$^2$ active area were fabricated utilizing the junction termination techniques according to embodiments of the present invention. The various junction termination configurations are described in Table 1 below. In Table 1, the devices are identified by the number of guard rings (GR), whether a junction termination extension (JTE) was present, and if so, where the JTE was located and if the charge compensation layer (p layer) was present in the device. The reference to 1-zone JTE refers to a device having a single doping level JTE. The various physical and electrical characteristics of the devices are also provided in Table 1. In Table 1, BV refers to breakdown voltage and the average (AVE) and maximum (MAX) breakdown voltage for devices on one of the six wafers fabricated are provided.

TABLE 1

| | | | Junction Termination Test Samples | | | | | |
|---|---|---|---|---|---|---|---|---|
| | 4 GR | 6 GR | 6 GR + JTE on Last GR | 8 GR | 6 GR + p layer A | 6 GR + p layer B | GR + JTE (Kinoshita et al) | 1-zone JTE |
| GR width | | | | | 3.25 µm | 3.0 µm | | |
| GR spacing | | | | | 1.75 µm | 2.0 µm | | |
| Active P layer dose | | | | | 3e12 | 3e12 | | |
| Active JTE dose | | | | | | | 1e13 | 1e13 |
| BV walkout | MOST | MOST | MOST | MOST | SOME | SOME | SOME | LEAST |
| Wafer1 AVE BV | 606.7 | 670.0 | 593 | 678 | 707 | 722 | 664.5 | 711.4 |
| Wafer1 Max BV | 742 | 787 | 808 | 824 | 851 | 870 | 820 | 825 |

TABLE 1-continued

Junction Termination Test Samples

| | 4 GR | 6 GR | 6 GR + JTE on Last GR | 8 GR | 6 GR + p layer A | 6 GR + p layer B | GR + JTE (Kinoshita et al) | 1-zone JTE |
|---|---|---|---|---|---|---|---|---|
| Wafer2 AVE BV | 623.7 | 639.2 | 660.0 | 676.3 | 685.6 | 722.2 | 712.6 | 741.9 |
| Wafer2 Max BV | 715 | 763 | 740 | 755 | 866 | 880 | 905 | 850 |
| Wafer3 AVE BV | 671.6 | 709.2 | 720.1 | 736.9 | 739.4 | 695.1 | 793.3 | 779.5 |
| Wafer3 Max BV | 748 | 817 | 836 | 843 | 907 | 968 | 979 | 1056 |
| Wafer4 AVE BV | 678.4 | 755 | 713 | 729.4 | 739.6 | 746.5 | 702.7 | 713.7 |
| Wafer4 Max BV | 906 | 880 | 922 | 904 | 915 | 885 | 790 | 905 |
| Wafer5 AVE BV | 717.9 | 755 | 781.6 | 776 | 821.1 | 801.1 | 855.6 | 804.4 |
| Wafer5 Max BV | 790 | 915 | 905 | 885 | 1007 | 947 | 1100 | 1046 |
| Wafer6 AVE BV | 637.8 | 696.2 | 656.2 | 602.9 | 631.6 | 660.1 | 654.4 | 686.4 |
| Wafer6 Max BV | 760 | 836 | 817 | 805 | 782 | 820 | 851 | 926 |

Six wafers were fabricated with doping densities for Wafer1 of ~7.1e15, Wafer2 of ~7.7e15, Wafer3 of 6.25e15, Wafer4 of 6.3e15, Wafer5 of 5.3e15 and Wafer6 of 5.5e15. All implants of the p-layer devices were performed at room temperature with a photoresist mask. However, other implant temperatures could be utilized. Boron was used as the dopant for all devices. FIGS. 7A through 12H are distribution plots for devices having the various termination types for the six wafers described in Table 1. As is seen from Table 1, the lightly doped p-layer may provide an improvement over similar guard ring devices without the charge compensation layer.

FIGS. 7A through 12H illustrate the breakdown voltage distribution between the devices of Table 1. FIGS. 7A, 8A, 9A, 10A, 11A and 12A are distribution plots of breakdown voltages for Schottky devices having a four guard ring termination structure provided on six separate wafers. FIGS. 7B, 8B, 9B, 10B, 11B and 12B are distribution plots of breakdown voltages for Schottky devices having a six guard ring termination structure provided on six separate wafers. FIGS. 7C, 8C, 9C, 10C, 11C and 12C are distribution plots of breakdown voltages for Schottky devices having an eight guard ring termination structure provided on six separate wafers. FIGS. 7D, 8D, 9D, 10D, 11D and 12D are distribution plots of breakdown voltages for Schottky devices having an eight guard ring with a JTE at the last guard ring termination structure provided on six separate wafers. FIGS. 7E, 8E, 9E, 10E, 11E and 12E are distribution plots of breakdown voltages for Schottky devices having a guard ring and JTE termination structure provided on six separate wafers similar to that described in Kinoshita et al., "Guard Ring Assisted RESURF: A New Termination Structure Providing Stable and High Breakdown Voltage for SiC Power Devices," *Tech. Digest of ISPSD* '02, pp. 253-256 (the Japan Paper). FIGS. 7F, 8F, 9F, 10F, 11F and 12F are distribution plots of breakdown voltages for Schottky devices having a 1.75 µm guard ring with a charge compensation layer termination structure provided on six separate wafers. FIGS. 7G, 8G, 9G, 10G, 11G and 12G are distribution plots of breakdown voltages for Schottky devices having a 2.0 µm guard ring with a charge compensation layer termination structure provided on six separate wafers. FIGS. 7H, 8H, 9H, 10H, 11H and 12H are distribution plots of breakdown voltages for Schottky devices having a JTE termination structure provided on six separate wafers.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of fabricating an edge termination structure for a silicon carbide semiconductor device, comprising:
   providing at least two spaced apart floating guard rings in a silicon carbide layer adjacent at least a portion of a silicon carbide-based semiconductor junction;
   providing an insulating layer on the floating guard rings; and
   providing a silicon carbide surface charge compensation region between the floating guard rings and adjacent the insulating layer, wherein the surface charge compensation region extends completely between adjacent ones of the floating guard rings, and wherein the surface charge compensation region has a dopant concentration such that the surface of the surface charge compensation region adjacent the insulating layer is partially depleted by surface charges of the insulating layer and fully depleted when a reverse bias lower than the blocking voltage of the device is applied to the device.

2. The method of claim 1, wherein providing a plurality of floating guard rings comprises forming a plurality of floating guard rings that extend a first distance into the silicon carbide layer and wherein providing a silicon carbide surface charge compensation region comprises forming a surface charge compensation region that extends a second distance into the silicon carbide layer, the second distance being less than the first distance.

3. The method of claim 1, wherein the surface charge compensation region is lighter doped than the guard rings.

4. The method of claim 1, wherein forming a silicon carbide surface charge compensation region comprises implanting regions in the silicon carbide layer.

5. The method of claim 1, wherein the surface charge compensation region comprises a plurality of surface charge compensation regions.

6. The method of claim 1, wherein the surface charge compensation region has a surface charge of from about $1 \times 10^{12}$ to about $7 \times 10^{12}$ cm$^{-2}$.

7. The method of claim 1, wherein the surface charge compensation region extends a distance of from about 0.1 μm to about 2.0 μm into the silicon carbide layer.

8. The method of claim 1, wherein the silicon carbide layer has a first conductivity type, and wherein the floating guard rings and the silicon carbide surface charge compensation region have a second conductivity type, opposite the first conductivity type.

9. A method of fabricating an edge termination structure for a silicon carbide semiconductor device, comprising:
providing a plurality of spaced apart concentric floating guard rings in a silicon carbide layer that surround at least a portion of a silicon carbide-based semiconductor junction;
providing an insulating layer on the floating guard rings; and
providing a silicon carbide surface charge compensation region between the floating guard rings and adjacent the insulating layer, wherein the surface charge compensation region comprises a single region that overlaps the floating guard rings, and wherein the surface charge compensation region has a dopant concentration such that the surface of the surface charge compensation region adjacent the insulating layer is partially depleted by surface charges of the insulating layer and fully depleted when a reverse bias lower than the blocking voltage of the device is applied to the device.

10. The method of claim 9, wherein providing a plurality of floating guard rings comprises forming a plurality of floating guard rings that extend a first distance into the silicon carbide layer and wherein providing a silicon carbide surface charge compensation region comprises forming a surface charge compensation region that extends a second distance into the silicon carbide layer, the second distance being less than the first distance.

11. The method of claim 9, wherein the surface charge compensation region is lighter doped than the guard rings.

12. The method of claim 9, wherein providing a silicon carbide surface charge compensation region comprises implanting regions in the silicon carbide layer.

13. The method of claim 9, wherein the surface charge compensation region comprises a plurality of surface charge compensation regions.

14. The method of claim 9, wherein the surface charge compensation region has a surface charge of from about $1 \times 10^{12}$ to about $7 \times 10^{12}$ cm$^{-2}$.

15. The method of claim 9, wherein the surface charge compensation region extends a distance of from about 0.1 μm to about 2.0 μm into the silicon carbide layer.

16. The method of claim 9, wherein the silicon carbide layer has a first conductivity type, and wherein the floating guard rings and the silicon carbide surface charge compensation region have a second conductivity type, opposite the first conductivity type.

17. A method of fabricating an edge termination structure for a silicon carbide semiconductor device, comprising:
providing a floating guard ring in a silicon carbide layer adjacent at least a portion of a silicon carbide-based semiconductor junction;
providing an insulating layer on the floating guard ring; and
providing a silicon carbide surface charge compensation region between the junction and the floating guard ring and adjacent the insulating layer, wherein the surface charge compensation region extends completely between the junction and the floating guard ring, and wherein the surface charge compensation region has a dopant concentration such that the surface of the surface charge compensation region adjacent the insulating layer is partially depleted by surface charges of the insulating layer and fully depleted when a reverse bias lower than the blocking voltage of the device is applied to the device.

* * * * *